United States Patent
Yun et al.

(10) Patent No.: US 11,522,064 B2
(45) Date of Patent: Dec. 6, 2022

(54) METAL OXIDE SEMICONDUCTOR FIELD-EFFECT TRANSISTOR (MOSFET) DEVICES AND MANUFACTURING METHODS THEREOF

(71) Applicant: Samsung Electronics Co., Ltd., Suwon-si (KR)

(72) Inventors: Sangjun Yun, Hwaseong-si (KR); Uihui Kwon, Hwaseong-si (KR); Seongnam Kim, Seoul (KR); Hyoshin Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 78 days.

(21) Appl. No.: 17/206,832

(22) Filed: Mar. 19, 2021

(65) Prior Publication Data

US 2021/0336026 A1   Oct. 28, 2021

(30) Foreign Application Priority Data

Apr. 28, 2020   (KR) .................. 10-2020-0051817
Sep. 9, 2020    (KR) .................. 10-2020-0115517

(51) Int. Cl.
*H01L 29/49*  (2006.01)
*H01L 29/78*  (2006.01)
(Continued)

(52) U.S. Cl.
CPC .... *H01L 29/4966* (2013.01); *H01L 21/28088* (2013.01); *H01L 29/66545* (2013.01); *H01L 29/66795* (2013.01); *H01L 29/7851* (2013.01)

(58) Field of Classification Search
CPC .................. H01L 29/4966; H01L 29/7851
See application file for complete search history.

(56) References Cited

U.S. PATENT DOCUMENTS 8,329,546 B2   12/2012   Lee et al.
8,723,236 B2   5/2014    Liu et al.
(Continued)

FOREIGN PATENT DOCUMENTS

KR   101279211 B1   6/2013

OTHER PUBLICATIONS

Arabi et al. "Short Course 1: Technolog Scaling in the EUV Era and Beyond" International Electron Devices Meeting (304 pages) (Dec. 8, 2019).

*Primary Examiner* — Christine A Enad
(74) *Attorney, Agent, or Firm* — Myers Bigel, P.A.

(57) ABSTRACT

Provided are metal oxide field-effect transistor (MOSFET) devices having a metal gate structure, in which a work function of the metal gate structure is uniform along a length direction of a channel, and manufacturing methods thereof. The MOSFET devices include a semiconductor substrate, an active area on the semiconductor substrate and extending in a first direction, and a gate structure on the semiconductor substrate. The gate structure extends across the active area in a second direction that traverses the first direction and comprises a high-k layer, a first metal layer, a work function control (WFC) layer, and a second metal layer, which are sequentially stacked on the active area. A lower surface of the WFC layer may be longer than a first interface between a lower surface of the first metal layer and an upper surface of the high-k layer in the first direction.

20 Claims, 20 Drawing Sheets

(51) Int. Cl.
*H01L 29/66* (2006.01)
*H01L 21/28* (2006.01)

(56) References Cited

U.S. PATENT DOCUMENTS

| | | |
|---|---|---|
| 9,397,189 B2 | 7/2016 | Chen et al. |
| 9,401,415 B2 | 7/2016 | Chang et al. |
| 10,446,662 B2 | 10/2019 | Bih et al. |
| 10,573,563 B2 | 2/2020 | Li |
| 2009/0212332 A1 | 8/2009 | Wang et al. |
| 2016/0315171 A1* | 10/2016 | Hung ................ H01L 29/66545 |
| 2016/0372382 A1 | 12/2016 | Lee et al. |
| 2018/0197786 A1* | 7/2018 | Li ...................... H01L 21/0273 |
| 2019/0259862 A1 | 8/2019 | Cheng et al. |

* cited by examiner

METAL OXIDE SEMICONDUCTOR FIELD-EFFECT TRANSISTOR (MOSFET) DEVICES AND MANUFACTURING METHODS THEREOF

CROSS-REFERENCE TO RELATED APPLICATIONS

This application is based on and claims priority under 35 U.S.C. § 119 to Korean Patent Applications No. 10-2020-0051817, filed on Apr. 28, 2020, and 10-2020-0115517, filed on Sep. 9, 2020, in the Korean Intellectual Property Office, the disclosures of which are incorporated by reference herein in their entireties.

BACKGROUND

The inventive concept relates to metal oxide semiconductor field-effect transistor (MOSFET) devices, and more particularly, to MOSFET devices including a metal gate structure and manufacturing methods of the MOSFET devices.

Due to the development of electronics technology, downscaling of semiconductor devices has recently progressed rapidly. Recently, because of demand for semiconductor devices to perform at a high speed and to perform accurate operations, various studies have been conducted for improving a structure of a transistor included in a semiconductor device, for example, a MOSFET.

SUMMARY

The inventive concept provides metal oxide semiconductor field-effect transistor (MOSFET) devices having a metal gate structure, in which a work function of the metal gate structure is uniform along a length direction of a channel, and manufacturing methods thereof.

According to some embodiments of the inventive concept, there are provided metal oxide field-effect transistor (MOSFET) devices, including: a semiconductor substrate; an active area on the semiconductor substrate and extending in a first direction; and a gate structure on the semiconductor substrate, the gate structure extending across the active area in a second direction that traverses the first direction and comprising an interface layer, a high-k layer, a first metal layer, a work function control (WFC) layer, and a second metal layer, which are sequentially stacked on the active area, and each of the high-k layer, the first metal layer, the WFC layer, and the second metal layer comprising a lower surface facing the semiconductor substrate and an upper surface opposite the lower surface, wherein the lower surface of the WFC layer is longer than a first interface between the lower surface of the first metal layer and the upper surface of the high-k layer in the first direction.

According to some embodiments of the inventive concept, there are provided MOSFET devices, including: a semiconductor substrate; an active area protruding from the semiconductor substrate and extending in a first direction; a gate structure on the semiconductor substrate, the gate structure extending in a second direction that traverses the first direction and covering at least a portion of the active area, the gate structure comprising an interface layer, a high-k layer, a first metal layer, a WFC layer, and a second metal layer, which are sequentially stacked on the active area, and each of the high-k layer, the first metal layer, the work function control (WFC) layer, and the second metal layer comprising a lower surface facing the semiconductor substrate and an upper surface opposite the lower surface; and source and drain areas respectively on side surfaces of the gate structure, the side surfaces of the gate structure being spaced apart from each other in the first direction, wherein the lower surface of the WFC layer is longer than a first interface between the lower surface of the first metal layer and the upper surface of the high-k layer in the first direction.

According to some embodiments of the inventive concept, there are provided manufacturing methods MOSFET device, the manufacturing method including: forming an active area having a fin shape, protruding from a semiconductor substrate and extending in a first direction; forming, on the semiconductor substrate, a dummy gate structure extending in a second direction that traverses the first direction and covering a portion of the active area; forming two spacers respectively on side surfaces of the dummy gate structure, the side surfaces of the dummy gate structure being spaced apart from each other in the first direction; removing the dummy gate structure between the two spacers; forming a high-k layer between the two spacers; etching inner side surfaces of the two spacers to increase distance between the two spacers; forming a first metal layer on an upper surface of the high-k layer; forming a WFC layer on the first metal layer; and forming a second metal layer on the WFC layer, wherein a lower surface of the WFC layer is longer than a first interface between a lower surface of the first metal layer and the upper surface of the high-k layer in the first direction.

According to some embodiments of the inventive concept, there are provided manufacturing methods of a MOSFET device, the manufacturing method including: forming an active area having a fin shape, protruding from a semiconductor substrate and extending in a first direction; forming, on the semiconductor substrate, a dummy gate structure extending in a second direction that traverses the first direction and covering a portion of the active region; forming two spacers respectively on side surfaces of the dummy gate structure, the side surfaces of the dummy gate structure being spaced apart from each other in the first direction; removing the dummy gate structure between the two spacers; conformally forming a high-k layer between the two spacers, the high-k layer comprising protruding portions extending respectively on inner side surfaces of the two spacers; conformally forming a first metal layer on the high-k layer, the first metal layer comprising protruding portions extending respectively on the inner side surfaces of the two spacers; removing the protruding portions of the high-k layer and the first metal layer; conformally forming a WFC layer on the high-k layer, the first metal layer, and the two spacers; and conformally forming a second metal layer on the WFC layer, wherein a lower surface of the WFC layer is longer than a first interface between a lower surface of the first metal layer and an upper surface of the high-k layer in the first direction.

According to some embodiments of the inventive concept, there are provided metal oxide field-effect transistor (MOSFET) devices, including: a substrate; an active area on the substrate; a gate structure on the active area, the gate structure comprising a high-k layer, a first metal layer, a work function control (WFC) layer, and a second metal layer that are sequentially stacked on the active area, and each of the high-k layer, the first metal layer, the WFC layer, and the second metal layer comprising a lower surface facing the active area and an upper surface opposite the lower surface; and source/drain regions respectively adjacent side surfaces of the gate structure. The lower surface of the WFC layer may protrude outwardly beyond opposing ends of an interface between the lower surface of the first metal layer and the upper surface of the high-k layer.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
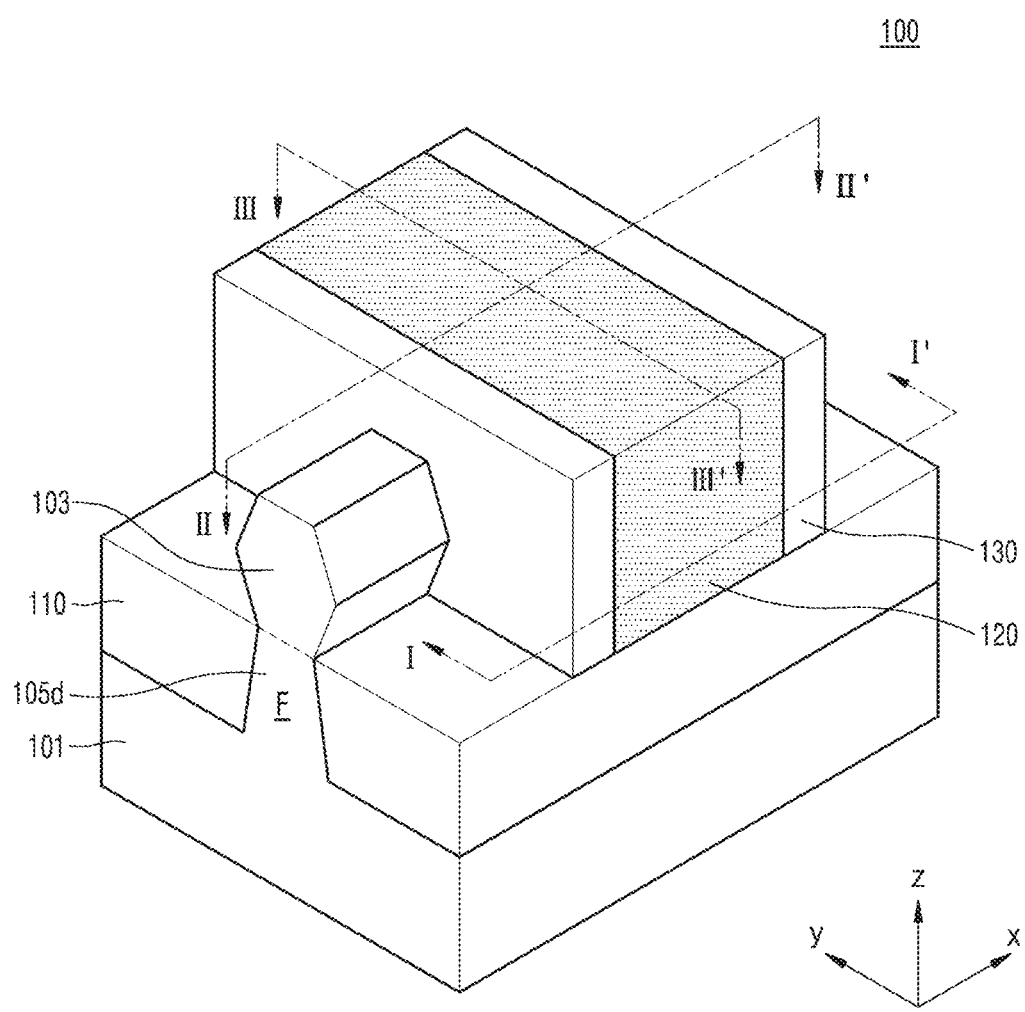
FIG. 1 is a perspective view and FIGS. 2A, 2B, and 2C are cross-sectional views of a metal oxide semiconductor field-effect transistor (MOSFET) device according to some embodiments of the inventive concept.

Hereinafter, the inventive concept will be described in detail by explaining example embodiments of the inventive concept with reference to the attached drawings. Like reference numerals denote like elements in different drawings, and redundant descriptions thereof may be omitted.

Figure 2A:
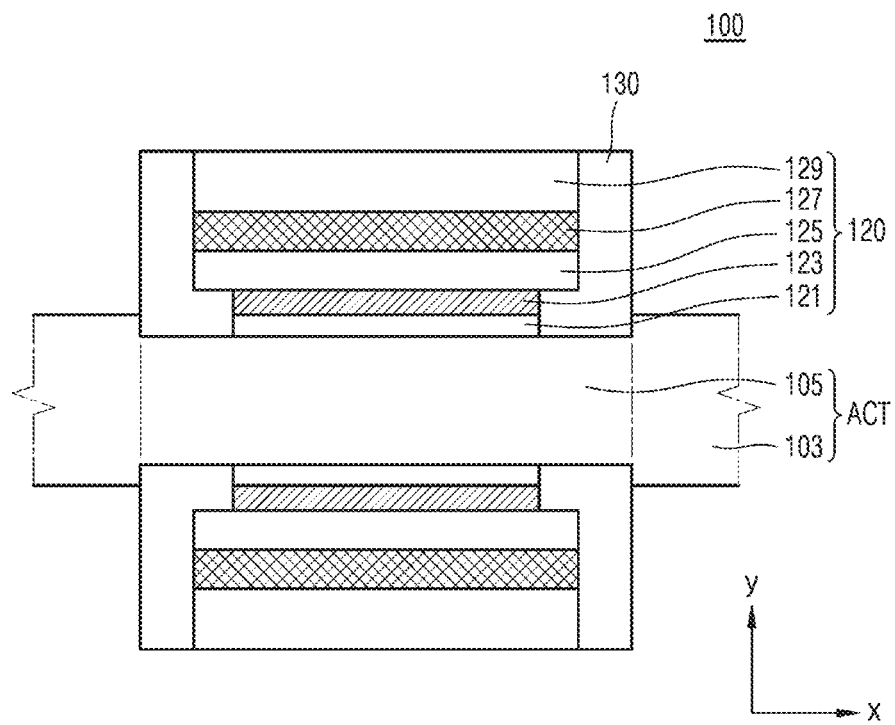
Figure 2B:
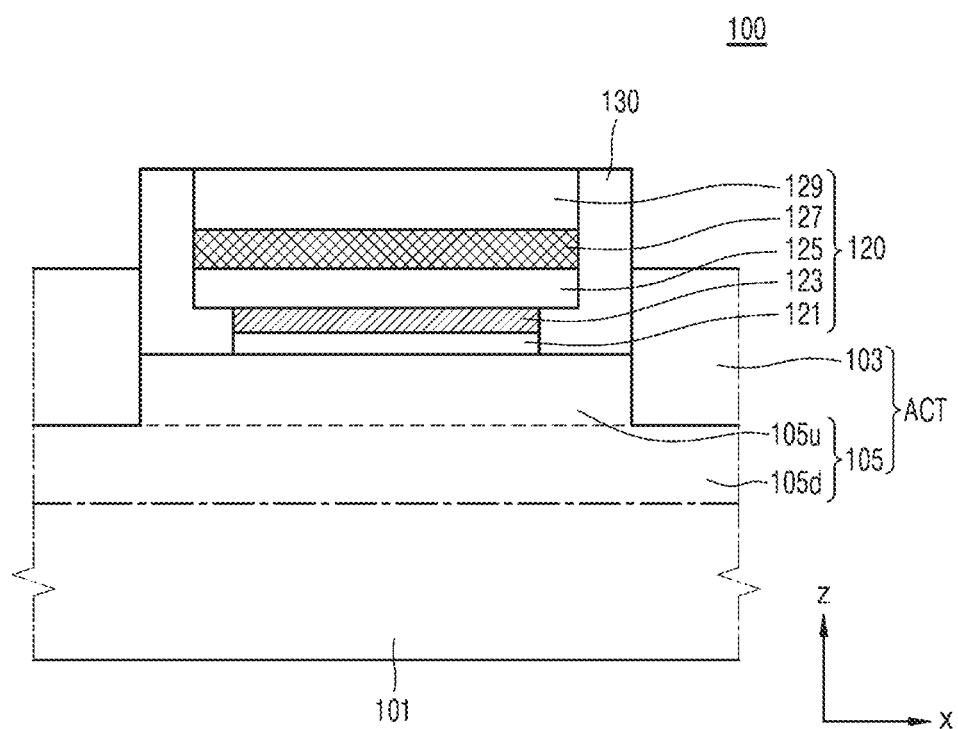
Figure 2C:
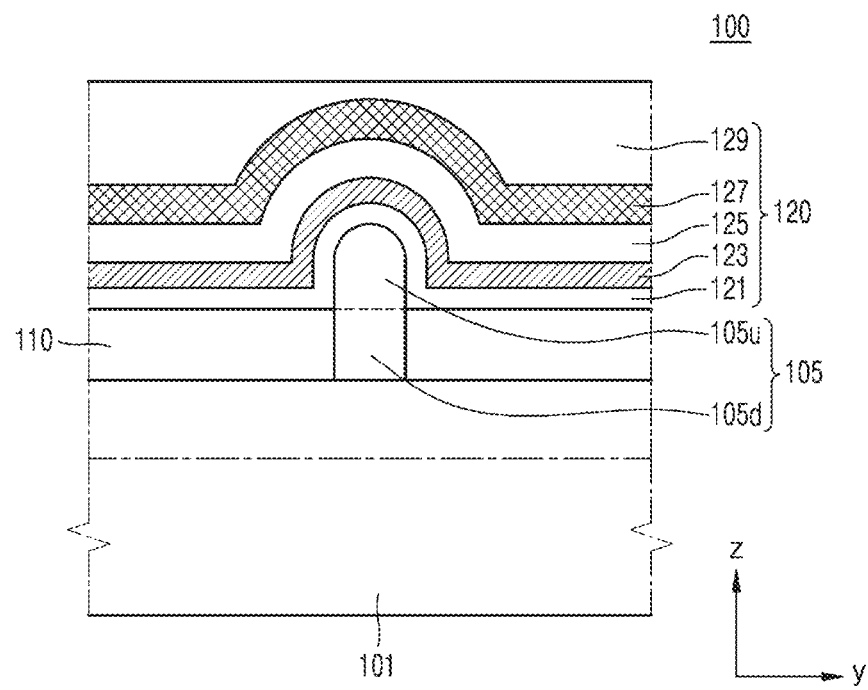

FIG. 1 is a perspective view and FIGS. 2A to 2C are cross-sectional views of a metal oxide semiconductor field-effect transistor (MOSFET) device 100 according to some embodiments of the inventive concept, wherein FIG. 2A is a horizontal cross-sectional view of the MOSFET device 100, taken along line I-I', and FIGS. 2B and 2C are vertical cross-sectional views of the MOSFET device 100, respectively taken along lines II-II' and III-III'.

Referring to FIGS. 1 to 2C, the MOSFET device 100 may include a semiconductor substrate 101, an active area ACT (hereinafter, referred to as "fin active area") of a fin F structure, and a gate structure 120.

The semiconductor substrate 101 may be or may include, for example, a silicon bulk wafer or a silicon-on-insulator (SOI) wafer. A material of the semiconductor substrate 101 is not limited to silicon. For example, the semiconductor substrate 101 may include a Group IV semiconductor such as germanium (Ge), a Group IV-IV compound semiconductor such as silicon-germanium (SiGe), silicon carbide (SiC), or the like, or a Group III-V compound semiconductor such as gallium arsenide (GaAs), indium arsenide (InAs), indium phosphide (InP), or the like. In some embodiments, the semiconductor substrate 101 may be or may include a SiGe wafer, an epitaxial wafer, a polished wafer, an annealed wafer, or the like. The semiconductor substrate 101 may be a p-type substrate including p-type impurity ions or an n-type substrate including n-type impurity ions. For example, in the MOSFET device 100 of the present embodiment, the semiconductor substrate 101 may be a p-type substrate.

The fin active area ACT may have a structure protruding from the semiconductor substrate 101 and extending in a first direction (an x-direction). A plurality of fin active areas ACT may be arranged on the semiconductor substrate 101 to be apart from each other in a second direction (a y-direction). The second direction (the y-direction) may traverse the first direction (the x-direction). In some embodiments, the second direction may be perpendicular to the first direction. The plurality of fin active areas ACT may be electrically insulated from each other through a device isolation film 110 or the like. As used herein, "an element A extends in a direction X" (or similar language) may mean that the element A extends longitudinally in the direction X.

Each of the plurality of fin active areas ACT may include a fin 105 and source/drain areas 103. The fin 105 may include a lower fin portion 105$d$, in which both side surfaces thereof are surrounded by the device isolation film 110, and an upper fin portion 105$u$ protruding from an upper surface of the device isolation film 110. The upper fin portion 105$u$ may be arranged below the gate structure 120 and may form a channel area. The source/drain areas 103 may be arranged on respective side surfaces of the gate structure 120 in the first direction (the x-direction) and may be arranged on the lower fin portion 105$d$.

The fin 105 may be formed based on the semiconductor substrate 101. In addition, the source/drain areas 103 may be formed through an epitaxial film growth by using the lower fin portion 105$d$ as a seed. According to some embodiments, the upper fin portion 105$u$ may also form the source/drain areas 103 on respective side surfaces of the gate structure 120. For example, the source/drain areas 103 may not be formed through a separate epitaxial film growth, but may be formed by the upper fin portion 105$u$ of the fin 105.

When the fin 105 is formed based on the semiconductor substrate 101, the fin 105 may include silicon or germanium, which are semiconductor elements. In addition, the fin 105 may include a compound semiconductor such as a Group IV-IV compound semiconductor or a Group III-V compound semiconductor. For example, the fin 105 may, as the Group IV-IV compound semiconductor, include a binary compound, a ternary compound, which includes at least two of carbon (C), silicon (Si), germanium (Ge), and tin (Sn), or a compound in which a Group IV element is doped with the binary compound and the ternary compound. In addition, for example, the fin 105 may, as the Group III-V compound semiconductor, include at least one of a binary compound, a ternary compound, and a quaternary compound, which are formed by combining at least one of aluminum (Al), gallium (Ga), and indium (In) as Group III elements and one of phosphorus (P), arsenic (As), and antimony (Sb) as Group V elements.

The source/drain areas 103 may be formed on respective side surfaces of the gate structure 120 and on the lower fin portion 105d and may include a compressive stress material or a tensile stress material according to a channel type of a transistor (e.g., a conductivity type of a transistor). For example, when the MOSFET device 100 forms a p-type metal oxide semiconductor (PMOS), the source/drain areas 103 on both side surfaces of the gate structure 120 may include a compressive stress material. In detail, when the lower fin portion 105d includes silicon, the source/drain areas 103 may, as a compressive stress material, include a material having a greater lattice constant than that of silicon, for example, silicon germanium (SiGe). In addition, when the MOSFET device 100 forms a NMOS, the source/drain areas 103 on both side surfaces of the gate structure 120 may include a tensile stress material. In detail, when the lower fin portion 105d includes silicon, the source/drain areas 103 may, as a tensile stress material, include silicon or a material having a lower lattice constant than that of silicon, for example, silicon carbide (SiC).

In the MOSFET device 100 of the present embodiment, the source/drain areas 103 may have various shapes. For example, when viewing the MOSFET device 100 in a shape of a cross-section perpendicular to the first direction (the x-direction), the source/drain areas 103 may have a shape such as a diamond, a circle, an ellipse, a polygon, a trapezoid, or the like. In FIG. 1, the source/drain area 103 is illustrated in a hexagonal diamond shape as an example.

The device isolation film 110 may be arranged on the semiconductor substrate 101. As shown in FIG. 2C, the device isolation film 110 may be arranged to cover both side surfaces of the lower fin portion 105d of the fin 105, which are spaced apart from each other in the second direction (the y-direction). The device isolation film 110 may electrically separate fins 105 arranged in the second direction (the y-direction). The device isolation film 110 may include, for example, at least one of a silicon oxide film, a silicon nitride film, a silicon oxynitride film, and a combination thereof. The upper fin portion 105u of the fin 105 may not be surrounded by the device isolation film 110 and may have a structure protruding from the upper surface of the device isolation film 110. In addition, as shown in FIGS. 2B and 2C, the upper fin portion 105u of the fin 105 may be arranged below the gate structure 120 and may form a channel area. As used herein, "an element A covers an element B" (or similar language) means that the element A is on and overlaps the element B but does not necessarily mean that the element A covers the element B entirely.

The gate structure 120 may cross the fin 105 on the device isolation film 110 and extend in the second direction (the y-direction). A plurality of gate structures 120 may be arranged with respect to one fin 105. For example, the plurality of gate structures 120 may traverse a single fin 105.

In addition, the plurality of gate structures 120 may be arranged to be spaced apart from each other in the first direction (the x-direction). Each of the plurality of gate structures 120 may be formed in a structure covering an upper surface of the upper fin portion 105u of the fin 105 and both side surfaces of the upper fin portion 105u.

Each of the plurality of gate structures 120 may include an interface layer 121, a high dielectric layer 123, a first metal layer 125, a work function control (WFC) layer 127, and a second metal layer 129.

The interface layer 121 may be formed above the semiconductor substrate 101 and may include an insulating material such as an oxide film, a nitride film, or an oxynitride film. For example, the interface layer 121 may include silicon oxide ($SiO_2$) or silicon oxynitride (SiON). The interface layer 121 may form a gate oxide film together with the high dielectric layer 123.

The high dielectric layer 123 is also referred to as a high-k layer, and may include a dielectric material having a high dielectric constant (k). The high dielectric layer 123 may include a hafnium-based (Hf-based) material or a zirconium-based (Zr-based) material. For example, the high dielectric layer 123 may include hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), zirconium silicon oxide (ZrSiO), or the like.

In some embodiments, the high dielectric layer 123 is not limited to a Hf-based material or a Zr-based material, and may include other materials, such as lanthanum oxide ($La_2O_3$), lanthanum aluminum oxide ($LaAlO_3$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), or the like.

The high dielectric layer 123 may be formed to have a thickness of several nanometers (nm) through various deposition methods such as atomic layer deposition (ALD), chemical vapor deposition (CDC), physical vapor deposition (PVD), or the like. However, the thickness of the high dielectric layer 123 is not limited to the above value. To adjust a diffusion amount of a WFC material from the WFC layer 127, a film structure, the thickness, or the like of the high dielectric layer 123 may be adjusted when forming the high dielectric layer 123. In addition, according to some embodiments, a heat treatment may be performed on the high dielectric layer 123.

The first metal layer 125 may be arranged on the high dielectric layer 123. The first metal layer 125 may include, for example, a nitride of titanium (Ti), a nitride of tantalum (Ta), an oxynitride of Ti, or an oxynitride of Ta. For example, the first metal layer 125 may include a bielement metal nitride such as titanium nitride (TiN), tantalum nitride (TaN), or the like, a tri-element metal nitride such as titanium aluminum nitride (TiAlN), tantalum aluminum nitride (TaAlN), titanium silicon nitride (TiSiN), or the like, or a form in which the metal nitrides are oxidized, that is, a metal oxynitride.

The first metal layer 125 may be formed to have a thickness of several nanometers (nm) through various deposition methods such as ALD, CVD, PVD, or the like. However, the thickness of the first metal layer 125 is not limited to the above value. To adjust a diffusion amount of the WFC material from the WFC layer to an interface between the first metal layer 125 and the high dielectric layer 123, when forming the first metal layer 125, a film structure, a composition of metal, the thickness, an operation temperature, operation time, or the like thereof may be adjusted. In addition, according to some embodiments, a heat treatment may be performed on the first metal layer 125.

The first metal layer 125 may form a metal electrode of the gate structure 120 together with the second metal layer 129 above the first metal layer 125. The first metal layer 125 may include a metal having certain work functions, and in addition, may assist a function of adjusting work functions of the WFC layer 127 by adjusting the diffusion amount of the WFC material from the WFC layer 127 to the interface of the first metal layer 125 and the high dielectric layer 123.

The WFC layer 127 may include the WFC material. For example, the WFC material of the WFC layer 127 may be Al. The WFC material of the WFC layer 127 is not limited to Al. In the MOSFET device 100 of the present embodiment, the WFC layer 127 may include, for example, titanium aluminum carbide (TiAlC) or titanium aluminum nitride (TiAlN). A material of the WFC layer 127 is not limited to the above materials.

The WFC layer 127 may supply the WFC material, for example, Al, to the interface (see Is1 of FIG. 3, hereinafter, simply referred to as "first interface") of the high dielectric layer 123 and the first metal layer 125 through diffusion. Herein, the first interface Is1 is not an entire interface in which the high dielectric layer 123 and the first metal layer 125 are in contact and may be defined as only a lower surface portion of a lower surface of the first metal layer 125, the lower surface portion being in contact with an upper surface of the high dielectric layer 123. The first interface Is1 will be described in more detail below in the descriptions of FIGS. 3 and 7.

Depending on an amount of the WFC material supplied to the first interface Is1 through diffusion, a work function or a threshold voltage of the gate structure 120 may be changed. For example, the work functions of the gate structure 120 may decrease as a concentration of the WFC material on the first interface Is1 increases. However, the inventive concept is not limited thereto. According to some embodiments, the work functions of the gate structure 120 may also increase as the concentration of the WFC material on the first interface Is1 increases.

The work functions of the gate structure 120 may not uniformly change throughout the gate structure 120 according to the concentration of the WFC material on the first interface Is1. In other words, in the work functions of the gate structure 120, a work function of a corresponding portion of the gate structure 120 may be changed according to the concentration of the WFC material at each position of the first interface Is1. For example, a work function of a portion of the gate structure 120 may depend on and may vary according to a concentration of the WFC material on a portion of the first interface Is1, which is included in the portion of the gate structure 120. In detail, when the first direction (the x-direction) is a length direction of the gate structure 120 or a length direction of a channel, and the gate structure 120 is divided into a gate center and a gate edge of both outer edges of the gate structure 120 in the first direction (the x-direction), the concentration of the WFC material of a center portion of the first interface Is1 corresponding to the gate center of the gate structure 120 may be high, and the concentration of the WFC material of an edge portion of the first interface Is1 corresponding to the gate edge of the gate structure 120 may be low. In this case, a work function of the gate edge of the gate structure 120 may be greater than a work function of the gate center of the gate structure 120. This phenomenon, in which in the length direction of the gate structure 120, the concentration of the WFC material is lower at the edge portion than at the center portion of the first interface Is1, such that the work function of the gate edge of the gate structure 120 becomes greater than that of the gate center thereof, is referred to as a gate work function roll-up (GWR) phenomenon.

The second metal layer 129 may be formed on the WFC layer 127 and may include an n-type metal or a p-type metal. For reference, the n-type metal may refer to a metal forming a gate electrode of an n-type metal oxide semiconductor (NMOS), and the p-type metal may refer to a metal forming a gate electrode of a PMOS. When the second metal layer 129 includes the n-type metal, the second metal layer 129 may include Ti or Ta. For example, the second metal layer 129 may include a metal material such as TiN, TiAlN, titanium aluminum carbonitride (TiAlC—N), titanium aluminum (TiAl), TaN, TaAlN, tantalum aluminum carbonitride (TaAlC—N), tantalum aluminum (TaAl), or the like. A material of the second metal layer 129, as the n-type metal, is not limited to the above materials. In addition, the second metal layer 129, as the n-type metal, may include a single layer or a multi-layer. When the second metal layer 129 includes a p-type metal, the second metal layer 129 may include at least one of molybdenum (Mo), palladium (Pd), ruthenium (Ru), platinum (Pt), TiN, tungsten nitride (WN), TaN, iridium (Ir), tantalum carbide (TaC), ruthenium nitride (RuN), and molybdenum nitride (MoN). The material of the second metal layer 129, as the p-type metal, is not limited to the above materials. In addition, the second metal layer 129, as the p-type metal, may include a single layer or a multi-layer.

According to some embodiments, the gate structure 120 may further include a gap-fill metal layer. A structure including the gap-fill metal layer will be described in more detail below in the descriptions of FIGS. 10A and 10B.

Spacers 130 may be arranged on both side surfaces of the gate structure 120, which are spaced apart from each other in the first direction (the x-direction). In addition, like the gate structure 120, the spacers 130 may have a structure extending in the second direction (the y-direction). Accordingly, similar to the gate structure 120, the spacers 130 may have a structure crossing the fin 105 and surrounding the upper surface of the upper fin portion 105u of the fin 105.

As shown in FIGS. 2A and 2B, each of the spacers 130 may have a step in an inner side surface thereof. That is, the inner side surface of the spacer 130 is in contact with the side surface of the gate structure 120, and because the interface layer 121 and the high dielectric layer 123 of the gate structure 120 are shorter than the first metal layer 125, the WFC layer 127, and the second metal layer 129 in the first direction (the x-direction), inner side surface portions of the spacers 130 corresponding to the interface layer 121 and the high dielectric layer 123 may have an inward structure. Accordingly, the inner side surfaces of the spacers 130 may have steps at a boundary portion of the high dielectric layer 123 and the first metal layer 125.

The spacers 130 may include an insulating material such as a nitride film or an oxynitride film. For example, the spacers 130 may include a silicon nitride film or a silicon oxynitride film. The spacers 130 may include a single layer or a multi-layer.

Although not illustrated in the drawings, an interlayer insulating film may be arranged on the device isolation film 110 to cover the source/drain areas 103. For example, the interlayer insulating film may have a structure surrounding upper and side surfaces of the source/drain areas 103 and also surrounding side surfaces of the spacers 130.

In the MOSFET device 100 of the present embodiment, an interface between the WFC layer 127 and the first metal layer 125 (see Is2 of FIG. 3, hereinafter, simply referred to as "second interface") is formed longer than the first interface Is1 in the length direction of the channel, that is, the first direction (the x-direction) in which the fin 105 extends, such that concentrations of the WFC material on the first interface Is1 may be uniform (e.g., uniform along the length direction of the channel), and the GWR phenomenon of the gate structure 120 may be suppressed. Accordingly, the MOSFET device 100 of the present embodiment enables a reliable MOSFET device having a uniform work function of a gate structure in a length direction of a channel. Herein, the second interface Is2 may be defined as a portion in which a lower surface of the WFC layer 127 contacts a layer thereunder (e.g., the first metal layer 125), and may be substantially the same as the lower surface of the WFC layer 127. The second interface Is2 and the GWR phenomenon will be described in more detail below in the descriptions of FIGS. 3 to 5, 7, and 8.

Figure 3:
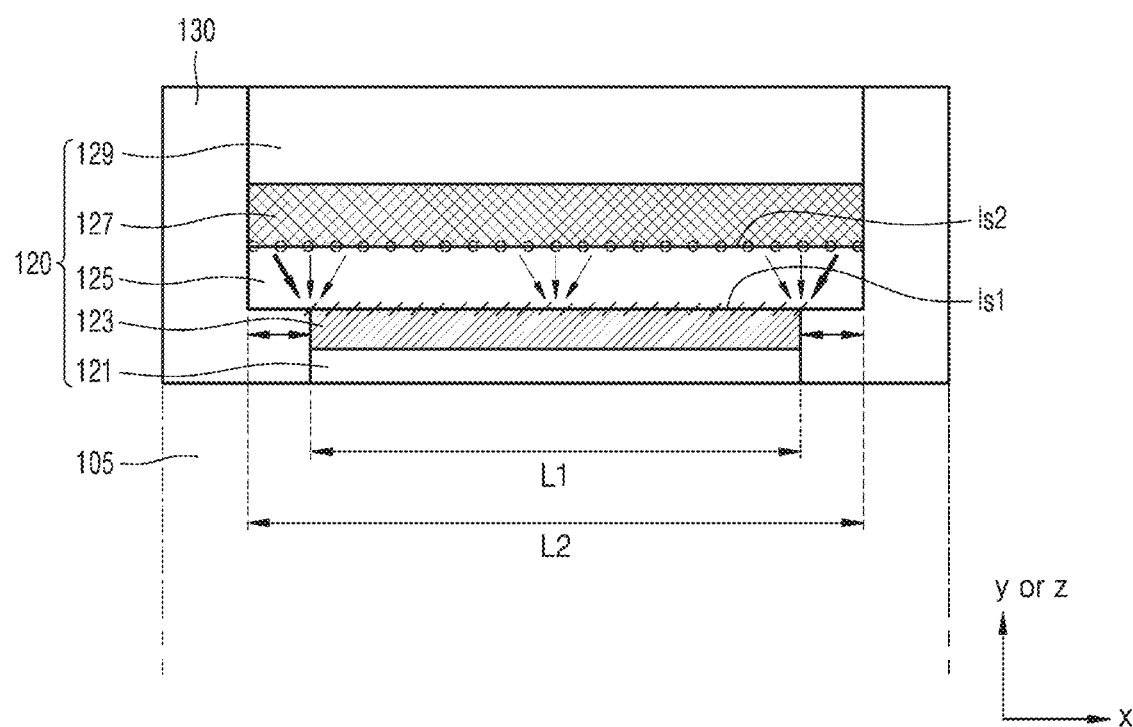
FIG. 3 is a conceptual diagram illustrating diffusion paths of a work function control (WFC) material in a gate structure of the MOSFET device of FIG. 1.

FIG. 3 is a conceptual diagram illustrating diffusion paths of the WFC material in the gate structure 120 of the MOSFET device 100 of FIG. 1 and may correspond to a portion of the gate structure 120 of FIGS. 2A and 2B.

Referring to FIG. 3, in the MOSFET device 100 of the present embodiment, the first interface Is1 may be defined as only a lower surface portion of the lower surface of the first metal layer 125, the lower surface portion being in contact with the upper surface of the high dielectric layer 123, and the second interface Is2 may be defined as a portion in which the lower surface of the WFC layer 127 contacts a layer thereunder. The first interface Is1 may be defined as a portion of a surface of the first metal layer 125, which directly contacts the high dielectric layer 123. Based on this definition, in FIG. 3, the first interface Is1 may have a first length L1 in the first direction (the x-direction), and the second interface Is2 may have a second length L2 in the first direction (the x-direction). The second length L2 may be greater than the first length L1. The second length L2 may be greater than the first length L1 by lengths of two small double-headed arrows at opposing sides of the high dielectric layer 123, which are spaced part from each other in the first direction (the x-direction). In some embodiments, the lower surface of the WFC layer 127 may protrude outwardly beyond opposing ends of the first interface Is1 as illustrated in FIG. 3. In some embodiments, portions of the lower surface of the WFC layer 127 that protrude beyond the respective opposing ends of the first interface Is1 have an equal length in the first direction (the x-direction).

In view of the diffusion paths of the WFC material of the WFC layer 127, the WFC material (for example, Al) may move from the second interface Is2 of the WFC layer 127 to the first interface Is1 in a third direction (a z-direction) or the second direction (the y-direction). In addition, as illustrated by small single-headed arrows, paths through which the WFC material diffuses from the second interface Is2 to each portion of the first interface Is1 may be substantially the same as each other in a center portion and an edge portion of the first metal layer 125. Accordingly, in the MOSFET device 100 of the present embodiment, the concentration of the WFC material at the center portion of the first interface Is1 may be substantially the same as the concentration of the WFC material at the edge portion of the first interface Is1 in the first direction (the x-direction). In other words, the concentrations of the WFC material on the first interface Is1 along the first direction (the x-direction) may be uniform, and accordingly, the GWR phenomenon may not occur in the gate structure 120 or may be greatly improved.

As illustrated in FIG. 3, numbers of diffusion paths through which the WFC material diffuses from the second interface Is2 or the WFC layer 127 to the center portion and the edge portion of the first interface Is1 may be substantially equal to each other, and thus the concentrations of the WFC material in the center portion and the edge portion of the first interface Is1 may be substantially equal to each other. In contrast, when a first MOSFET device (also referred to as a first comparative MOSFET device) includes the first interface Is1 and the second interface Is2 that have equal lengths in the first direction (the x-direction), diffusion paths represented by bold arrows in FIG. 3 may not exist. Therefore, the concentration of the WFC material at the edge portion of the first interface Is1 may be lower than that at the center portion of the first interface Is1, and the GWR phenomenon may be caused by the difference in the concentrations of the WFC material on the first interface Is1.

Figure 4A:
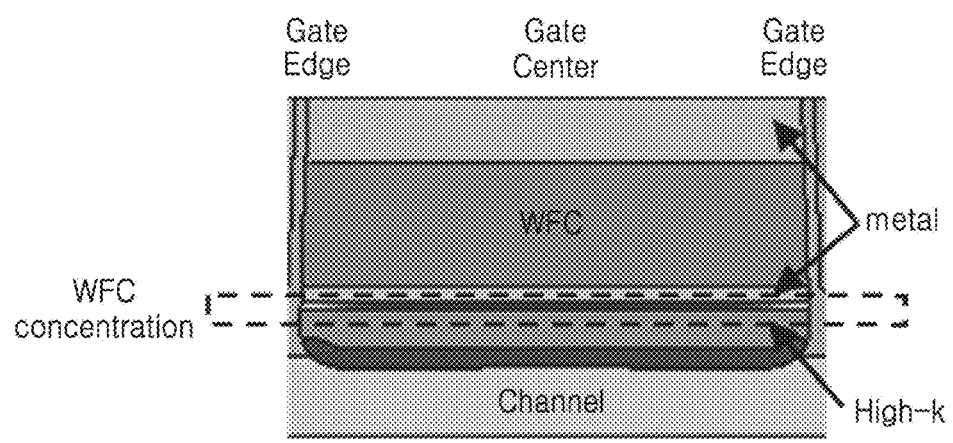
FIGS. 4A and 4B are simulation pictures respectively showing a concentration of a WFC material on an interface between a high dielectric layer and a first metal layer in a first comparative MOSFET device and the MOSFET device of FIG. 1.
Figure 4B:
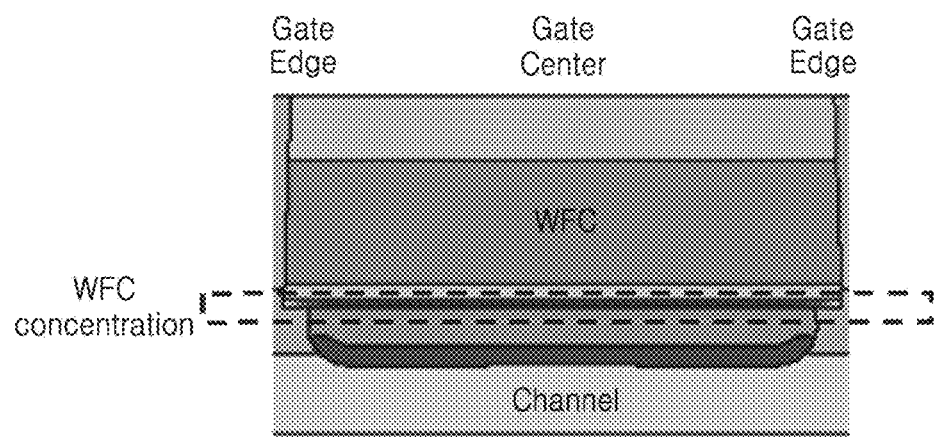

FIGS. 4A and 4B are simulation pictures respectively showing a concentration of a WFC material on a first interface between a high dielectric layer and a first metal layer in the first comparative MOSFET device and the MOSFET device of FIG. 1.

Referring to FIG. 4A, the first comparative MOSFET device may have a high concentration of the WFC material in the center portion of the first interface of the gate center of the gate structure 120 and may have a low concentration of the WFC material in the edge portion of the first interface of the gate edges of the gate structure 120. The first interface is enclosed by the dotted line in the FIG. 4A. For reference, the darker the first interface, the higher the concentration of the WFC material, and the lighter the first interface, the lower the concentration of the WFC material.

On the other hand, the MOSFET device 100 of the present embodiment of FIG. 4B may have a concentration of the WFC material in the center portion of the first interface of the gate center of the gate structure 120 that is substantially equal to a concentration of the WFC material in the edge portion of the first interface of the gate edges of the gate structure 120. Although there are some bright portions in the lower surface of the first metal layer 125 of the gate edges, because the bright portions are not included on the first interface and do not correspond to a channel area, the bright portions are not related to an adjustment of (e.g., may not affect) the work function of the gate structure 120 or the GWR phenomenon.

Figure 5:
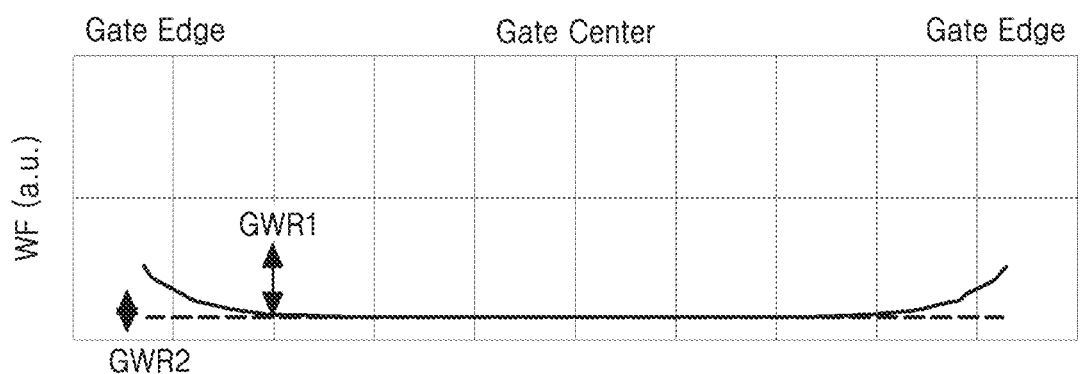
FIG. 5 is a graph showing work functions of each portion of a gate structure of the first comparative MOSFET device and the MOSFET of FIG. 1.

FIG. 5 is a graph showing work functions in each portion of the gate structure 120 of the first comparative MOSFET device and the MOSFET device 100 of FIG. 1, wherein a solid line represents work functions of the first comparative MOSFET device, and a dashed line represents work functions of the MOSFET device 100 of FIG. 1. The x-axis represents a position in the gate structure 120, the y-axis represents work functions, and a unit may be an arbitrary unit.

Referring to FIG. 5, regarding the GWR phenomenon in which the work function of the gate edge of the gate structure 120 is greater than the work function of the gate center of the gate structure 120, a difference in work functions between the gate center and the gate edge is a first GWR GWR1 in the first comparative MOSFET device, and is a second GWR GWR2 in the MOSFET device 100 of the present embodiment. The first GWR GWR1 may be relatively large, for example, about 100 meV. On the other hand, the second GWR GWR2 may be very small, for example, less than 10 meV, and in addition, according to some embodiments, the second GWR GWR2 may decrease to almost zero. In some embodiments, the second GWR GWR2 may be about zero. When the work function of the gate center is about 4.5 eV, the first GWR GWR1 is about 2.25% of the work function of the gate center, which is greater than 1% of the work function of the gate center, and the second GWR GWR2 may be about 0.2% of the work function of the gate center, which is less than 1% of the work function of the gate center. In other words, in the MOSFET device 100 of the present embodiment, the GWR may be reduced to 1/10 or less compared to that of the first comparative MOSFET device.

When the GWR phenomenon is reduced, the controllability of the gate structure 120 may be improved, and direct current (DC) performance of the MOSFET device 100 may be improved. Herein, the DC performance may mean, for example, off-current performance, and when the off-current performance is good, little current flows below an operating voltage, and leakage may be minimized. The DC performance is not limited to the off-current performance. For example, in the MOSFET device 100 according to the present embodiment, the DC performance may be improved by 2% or more as compared to that of the first comparative MOSFET device.

The MOSFET device 100 of the present embodiment may include the gate structure 120 having a structure in which the second interface Is2 is longer than the first interface Is1 in the first direction (the x-direction), which is the length direction of the channel, such that the concentrations of the WFC material on the first interface Is1 may be uniform (e.g., uniform along the first direction (the x-direction)), and the work functions of the gate structure 120 may be uniform (e.g., uniform along the first direction (the x-direction)). Accordingly, the MOSFET device 100 of the present embodiment reduces the GWR phenomenon of the gate structure 120 to almost zero, thereby implementing a reliable MOSFET device.

Figure 6A:
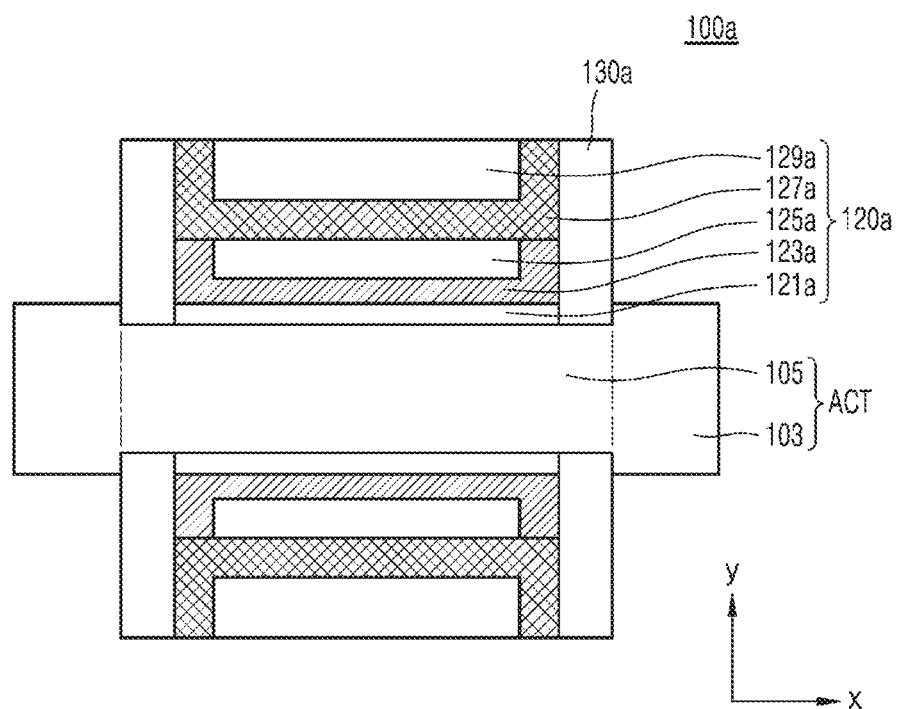
FIGS. 6A and 6B are cross-sectional views of a MOSFET device according to some embodiments of the inventive concept.
Figure 6B:
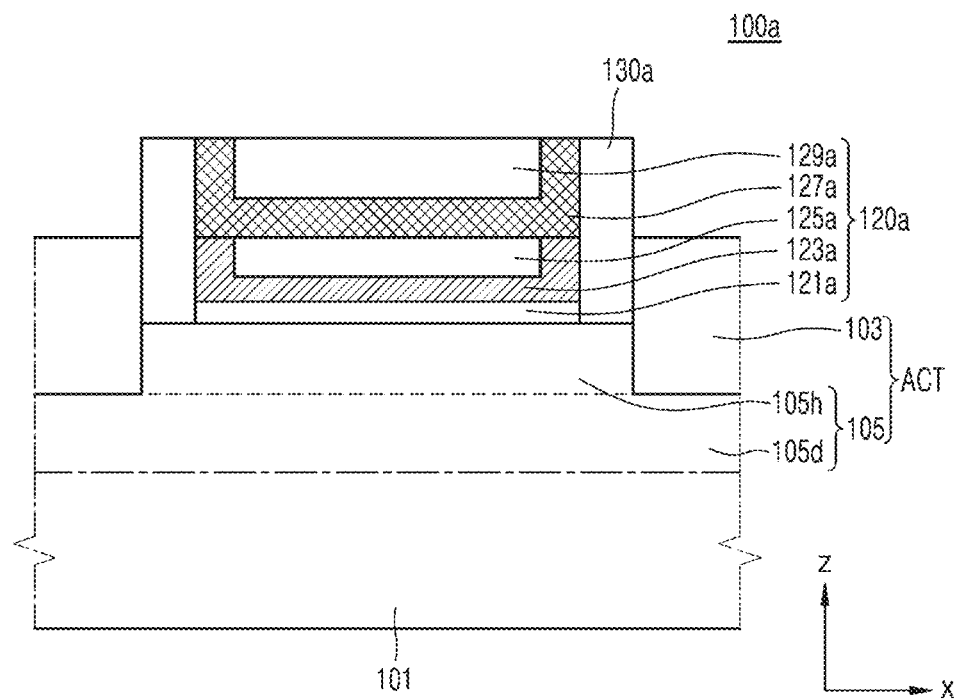

FIGS. 6A and 6B are cross-sectional views of a MOSFET device 100a according to some embodiments of the inventive concept, which correspond to FIGS. 2A and 2B, and a cross-sectional view of the MOSFET device 100a corresponding to FIG. 2C is substantially the same as FIG. 2C and thus will be omitted. Descriptions already given with respect to FIGS. 1 to 2C are briefly given or omitted below.

Referring to FIGS. 6A and 6B, the MOSFET device 100a of the present embodiment may be different from the MOSFET device 100 of FIG. 1 in a structure of a gate structure 120a. In detail, in the MOSFET device 100a of the present embodiment, a high dielectric layer 123a may have a U-shape covering a lower surface of a first metal layer 125a and both side surfaces of the first metal layer 125a, which are spaced apart from each other in the first direction (the x-direction). Due to the U-shape of the high dielectric layer 123a, an upper surface of the first metal layer 125a and upper surfaces of protruding portions on both sides of the high dielectric layer 123a may be on substantially the same plane and may be in contact with a lower surface of a WFC layer 127a.

In addition, the WFC layer 127a may have a U-shape covering a lower surface of a second metal layer 129a and both side surfaces of the second metal layer 129a, which are spaced apart from each other in the first direction (the x-direction). Due to the U-shape of the WFC layer 127a, an upper surface of the second metal layer 129a, upper surfaces of protruding portions on both sides of the WFC layer 127a, and upper surfaces of spacers 130a may be on substantially the same plane.

Side surfaces of an interface layer 121a, the high dielectric layer 123a, and the WFC layer 127a may form side surfaces of the gate structure 120a and may be on substantially the same plane. Due to the side surfaces structure of the gate structure 120a, inner side surfaces of the spacers 130a surrounding the side surfaces of the gate structure 120a may have a planar shape without a step.

Figure 7:
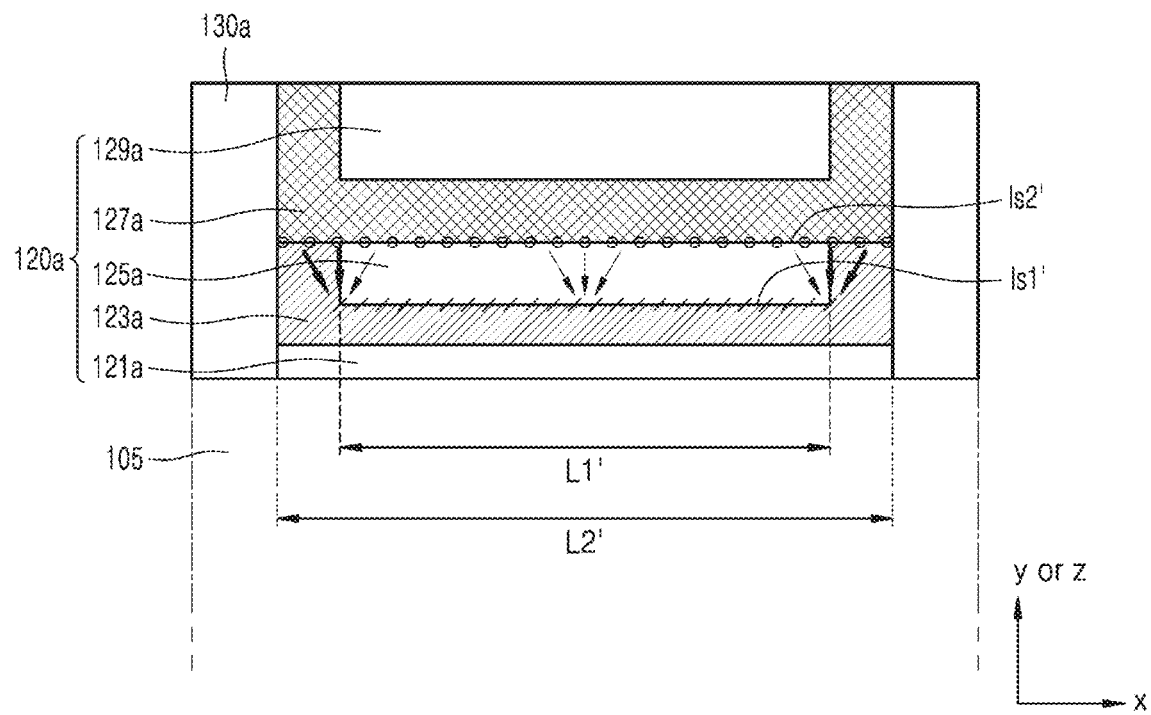
FIG. 7 is a conceptual diagram illustrating diffusion paths of a WFC material in a gate structure of the MOSFET device of FIG. 6A.

In the MOSFET device 100a of the present embodiment, a lower surface of the first metal layer 125a and an inner bottom surface of the high dielectric layer 123a in contact therewith form a first interface (see Is1' of FIG. 7), and a lower surface of the WFC layer 127a and an upper surface of the first metal layer 125a and upper surfaces of the protruding portions of the high dielectric layer 123a on both sides of the high dielectric layer 123a in contact with the lower surface of the WFC layer 127a may form a second interface (see Is2' of FIG. 7). The first interface Is1' and the second interface Is2' will be described in more detail below in the descriptions of FIG. 7. In addition, the second interface Is2' may be longer than the first interface Is1' in the first direction (the x-direction), which is the length direction of a channel. Accordingly, similar to the MOSFET device 100 of FIG. 1, the MOSFET device 100a of the present embodiment may have a uniform concentration of the WFC material on the first interface Is1', and accordingly, the GWR phenomenon may not occur in the gate structure 120a or may be improved.

FIG. 7 is a conceptual diagram illustrating diffusion paths of the WFC material in the gate structure 120a of the MOSFET device of FIG. 6A, which may correspond to a portion of the gate structure 120a of FIG. 6A or 6B.

Referring to FIG. 7, in the MOSFET device 100a of the present embodiment, the first interface Is1' may be a lower surface portion of the first metal layer 125a in contact with the inner bottom surface of the high dielectric layer 123a, and the second interface Is2' may be a lower surface portion of the WFC layer 127a in contact with the upper surface of the first metal layer 125a and upper surfaces of the protruding portions of the high dielectric layer 123a on both sides of the high dielectric layer 123a.

In FIG. 7, the first interface Is1' may have a first length L1' in the first direction (the x-direction), and the second interface Is2' may have a second length L2' in the first direction (the x-direction). The second length L2' may be greater than the first length L1', and in addition, the second interface Is2' may be longer than the first interface Is1' at both edge portions that are spaced apart from each other in the first direction (the x-direction).

In view of the diffusion paths of the WFC material of the WFC layer 127a, the WFC material (for example, Al) may move from the second interface Is2' to the first interface Is1' in the third direction (the z-direction) or the second direction (the y-direction). In addition, as illustrated by small arrows, paths through which the WFC material diffuses from the second interface Is2' to each portion of the first interface Is1' may be substantially the same as each other. Accordingly, in the MOSFET device 100a of the present embodiment, the concentration of the WFC material at the center portion of the first interface Is1' may be substantially the same as the concentration of the WFC material at the edge portion of the first interface Is1'. In other words, the concentrations of the WFC material on the first interface Is1' may be uniform along the first direction (the x-direction), and accordingly, the GSW phenomenon may not occur in the gate structure 120a or may be greatly improved.

In contrast, when a second MOSFET device (also referred to as a second comparative MOSFET device) includes layers all similar to layers of gate structure 120a except an interface layer have a U-shaped shape, a second interface may be shorter than a first interface in a first direction and paths illustrated by bold arrows among paths through which the WFC material in the MOSFET device 100a of the present embodiment diffuses from the second interface Is2' to the edge portion of the first interface Is1', may not exist. As a result, as compared with the first comparative MOSFET device, in the second comparative MOSFET device, a difference in concentrations of the WFC material between the edge portion and the center portion of the first interface Is1 may increase, and the increased difference in concentrations of the WFC material may cause more serious GWR problems.

Figure 8:
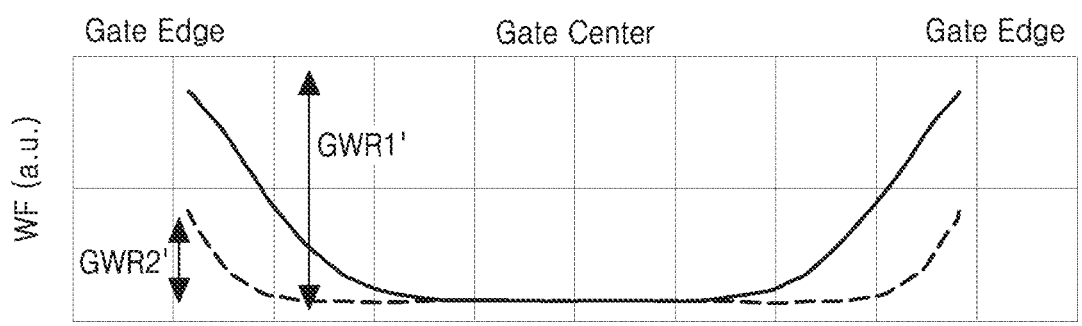
FIG. 8 is a graph showing work functions of each portion of a gate structure of a second comparative MOSFET device and the MOSFET device of FIG. 6A.

FIG. 8 is a graph showing work functions of each portion of the gate structure 120a of the second comparative MOSFET device and the MOSFET device 100a of FIG. 6A, wherein a solid line represents work functions of the second comparative MOSFET device, and a dashed line represents work functions of the MOSFET device 100a of FIG. 6A. The x-axis represents a position in the gate structure 120a, the y-axis represents work functions, and a unit may be an arbitrary unit.

Referring to FIG. 8, regarding the GWR phenomenon, in which a work function of a gate edge of the gate structure 120a is greater than a work function of a gate center of the gate structure 120a, a difference in work functions between the gate center and the gate edge in the second comparative MOSFET device is a first GWR GWR1', and a difference in work functions between the gate center and the gate edge in the MOSFET device 100a is a second GWR GWR2'. The first GWR GWR1' may be relatively large, for example, about several hundreds meV. For example, the second GWR GWR2' may be, for example, less than 50% of the first GWR GWR1'.

When the work function of the gate center is about 4.5 eV, the first GWR GWR1' is about 350 meV, and the second GWR GWR2' is about 150 meV, the first GWR GWR1' may be about 7.8% and the second GWR GWR2' may be about 3.3% of the work function of the gate center. In other words, in the MOSFET device 100a of the present embodiment, the GWR may be reduced to about 4/10 as compared to that of the second comparative MOSFET device. In addition, in the MOSFET device 100a of the present embodiment, the DC performance may be improved by 6% or more as compared to that of the second comparative MOSFET device.

Accordingly, the MOSFET device 100a of the present embodiment may include the second interface Is2' that is longer than the first interface Is1' in the first direction (the x-direction), which is the length direction of the channel, such that the concentrations of the WFC material on the first interface Is1' may be uniform (e.g., uniform along the first direction), and the work functions of the gate structure 120a may be uniform (e.g., uniform along the first direction). Accordingly, the MOSFET device 100a of the present embodiment greatly reduces the GWR phenomenon of the gate structure 120a, thereby implementing a reliable MOSFET device.

FIGS. 9A to 9D are cross-sectional views of MOSFET devices according to some embodiments of the inventive concept, which are cross-sectional views corresponding to FIG. 2A. Descriptions already given with respect to FIGS. 1 to 2C, 6A, and 6B are briefly given or omitted below.

Figure 9A:
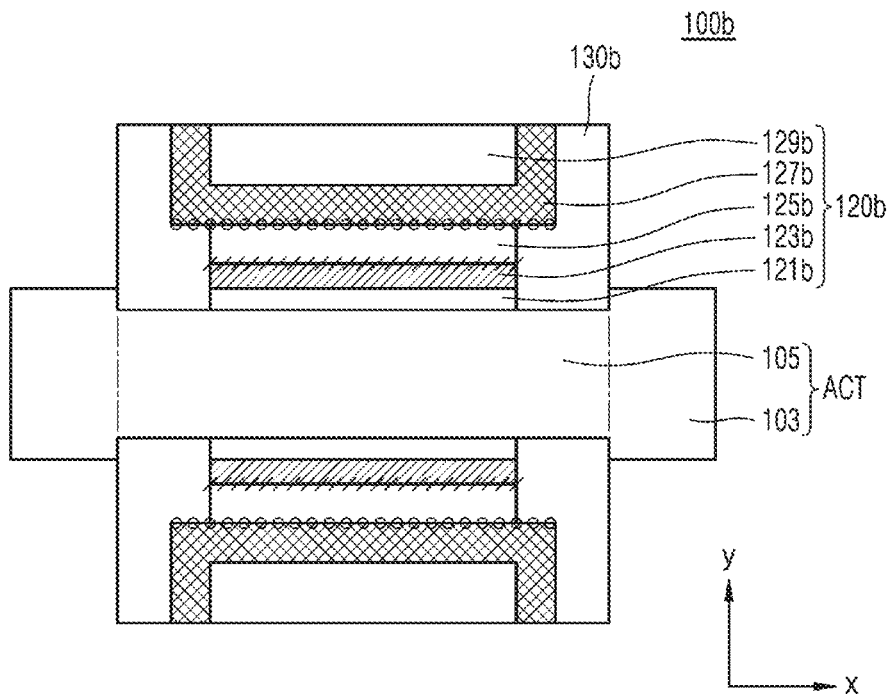
FIGS. 9A to 9D are cross-sectional views of a MOSFET device according to some embodiments of the inventive concept.

Referring to FIG. 9A, a MOSFET device 100b of the present embodiment may be different from the MOSFET device 100a of FIG. 6A in that only a WFC layer 127b has a U-shape. In detail, in the MOSFET device 100b of the present embodiment, an interface layer 121b, a high dielectric layer 123b, and a first metal layer 125b may have a uniform thickness (e.g., a thickness in the second direction (y-direction)) along the first direction (the x-direction). In addition, the WFC layer 127b may have a U-shape covering a lower surface of a second metal layer 129b and both side surfaces of the second metal layer 129b, which are spaced apart from each other in the first direction (the x-direction). Due to the U-shape of the WFC layer 127b, an upper surface of the second metal layer 129b, upper surfaces of protruding portions on both sides of the WFC layer 127b, and upper surfaces of spacers 130b may be on substantially the same plane. An inner side surface of each of the spacers 130b may have a step.

In the MOSFET device 100b of the present embodiment, a lower surface of the first metal layer 125b and an upper surface of the high dielectric layer 123b in contact therewith may form a first interface, and a lower surface of the WFC layer 127b may form a second interface. In addition, the second interface may be longer than the first interface in the first direction (the x-direction), which is the length direction of a channel. Accordingly, in the MOSFET device 100b of the present embodiment, the concentrations of the WFC material on the first interface may be uniform (e.g., uniform along the first direction (the x-direction)), and the GWR phenomenon may not occur in a gate structure 120b or may be improved.

Figure 9B:
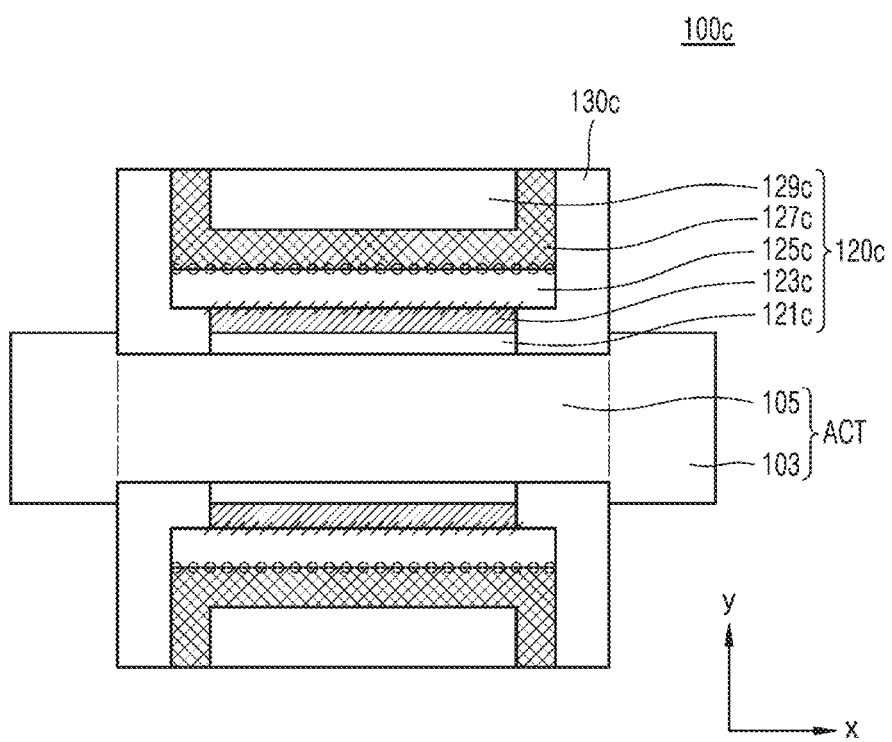

Referring to FIG. 9B, a MOSFET device 100c of the present embodiment may be different from the MOSFET device 100 of FIG. 2A in that a WFC layer 127c has a U-shape. In detail, in the MOSFET device 100c of the present embodiment, an interface layer 121c, a high dielectric layer 123c, and a first metal layer 125c may have a uniform thickness (e.g., a thickness in the second direction (y-direction)) along the first direction (the x-direction), the interface layer 121c and the high dielectric layer 123c may have the same length in the first direction (the x-direction), and the first metal layer 125c may be longer than the high dielectric layer 123c in the first direction (the x-direction). In addition, the WFC layer 127c may have a U-shape covering a lower surface of a second metal layer 129c and both side surfaces of the second metal layer 129c, which are spaced apart from each other in the first direction (the x-direction). Due to the U-shape of the WFC layer 127c, an upper surface of the second metal layer 129c, upper surfaces of protruding portions of the WFC layer 127c on both sides of the WFC layer 127c, and upper surfaces of the spacers 130c may be on substantially the same plane. An inner side surface of each of the spacers 130c may have a step.

In the MOSFET device 100c of the present embodiment, a lower surface of the first metal layer 125c and an upper surface of the high dielectric layer 123c in contact therewith may form a first interface, and a lower surface of the WFC layer 127b and an upper surface of the first metal layer 125c in contact therewith may form a second interface. In addition, the second interface may be longer than the first interface in the first direction (the x-direction), which is the length direction of a channel. Accordingly, in the MOSFET device 100c of the present embodiment, the concentrations of the WFC material on the first interface may be uniform (e.g., uniform along the first direction (the x-direction)), and the GWR phenomenon may not occur in a gate structure 120c or may be improved.

Figure 9C:
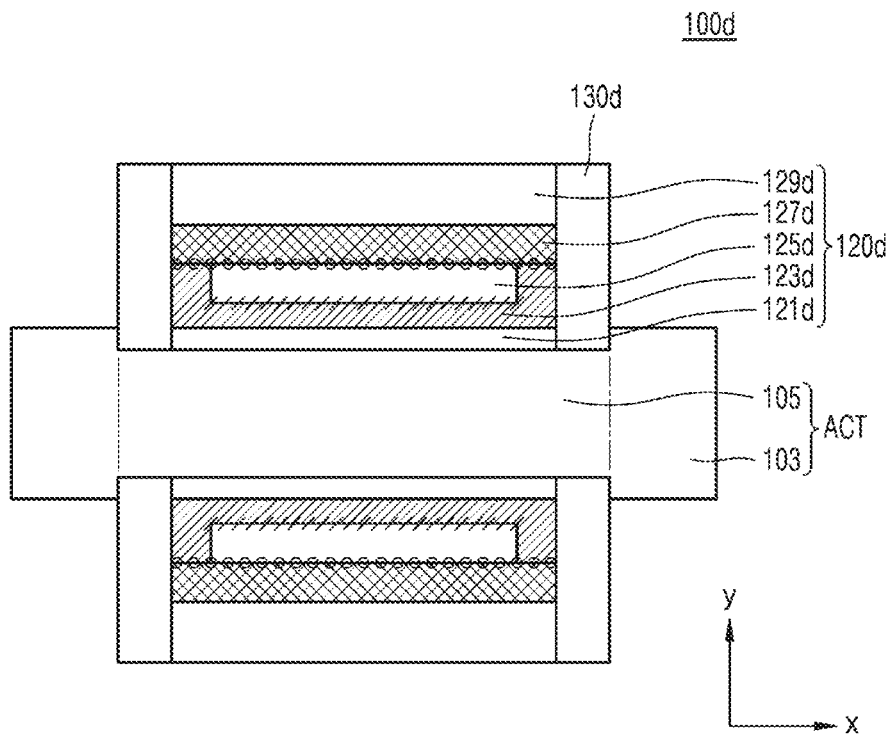

Referring to FIG. 9C, a MOSFET device 100d of the present embodiment may be different from the MOSFET device 100a of FIG. 6A in that only a high dielectric layer 123d has a U-shape. In detail, in the MOSFET device 100d of the present embodiment, the high dielectric layer 123d may have a U-shape covering a lower surface of a first metal layer 125d and both side surfaces of the first metal layer 125d, which are spaced apart from each other in the first direction (the x-direction). Due to the U-shape of the high dielectric layer 123d, an upper surface of the first metal layer 125d and upper surfaces of protruding portions of the high dielectric layer 123d on both sides of the high dielectric layer 123d may be on substantially the same plane and may be in contact with a lower surface of a WFC layer 127d. The WFC layer 127d and a second metal layer 129d may have a uniform thickness (e.g., a thickness in the second direction (y-direction)) along the first direction (the x-direction). An inner side surface of each of spacers 130d may not have a step.

In the MOSFET device 100d of the present embodiment, the lower surface of the first metal layer 125d and an inner bottom surface of the high dielectric layer 123d in contact therewith may form a first interface, and the lower surface of the WFC layer 127d and the upper surface of the first metal layer 125d and the upper surfaces of the protruding portions of the high dielectric layer 123d on both sides of the high dielectric layer 123d in contact with the lower surface of the WFC layer 127d may form a second interface. In addition, the second interface may be longer than the first interface in the first direction (the x-direction), which is the length direction of a channel. Accordingly, in the MOSFET device 100d of the present embodiment, the concentrations of the WFC material on the first interface may be uniform (e.g., uniform along the first direction (the x-direction)), and the GWR phenomenon may not occur in a gate structure 120d or may be improved.

Figure 9D:
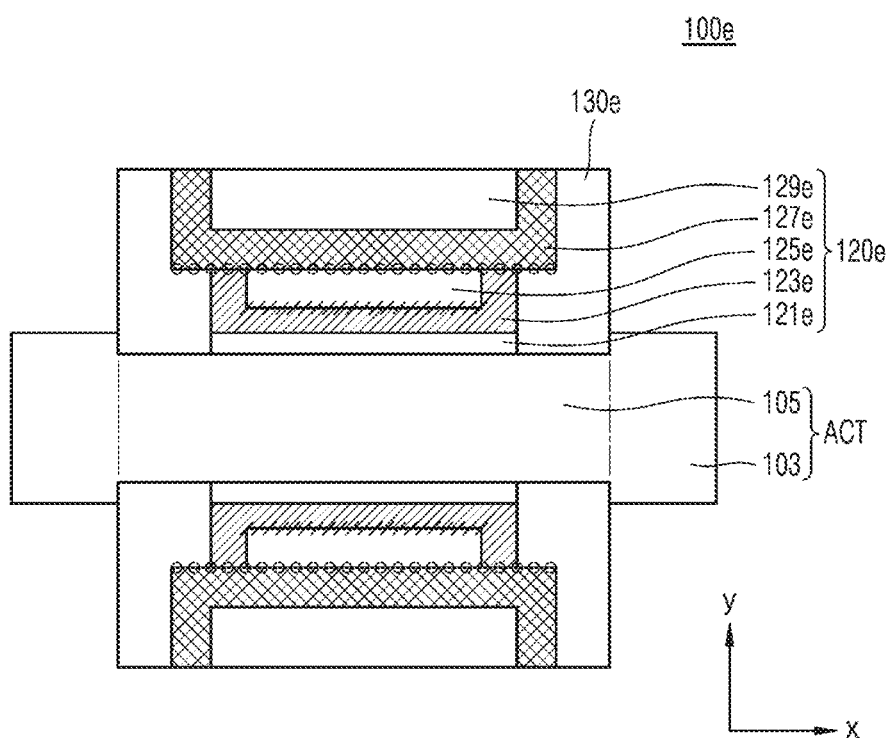

Referring to FIG. 9D, a MOSFET device 100e may be different from the MOSFET device 100a of FIG. 6A in that a U-shape of a WFC layer 127e is formed longer than a U-shape of a high dielectric layer 123e in the first direction (the x-direction). In detail, in the MOSFET device 100e of the present embodiment, the high dielectric layer 123e may have a U-shape covering a lower surface of a first metal layer 125e and both side surfaces of the first metal layer 125e, which are spaced apart from each other in the first direction (the x-direction). Due to the U-shape of the high dielectric layer 123e, an upper surface of the first metal layer 125e and upper surfaces of protruding portions of the high dielectric layer 123e on both sides of the high dielectric layer 123e may be on substantially the same plane and may be in contact with the WFC layer 127e.

In addition, the WFC layer 127e may have a U-shape covering a lower surface of a second metal layer 129e and both side surfaces of the second metal layer 129e, which are spaced apart from each other in the first direction (the x-direction). Due to the U-shape of the WFC layer 127e, an upper surface of the second metal layer 129e, upper surfaces of the protruding portions of the WFC layer 127e on both sides of the WFC layer 127e, and upper surfaces of spacers 130e may be on substantially the same plane. However, as shown in FIG. 9D, the lower surface of the WFC layer 127e may be longer than the lower surface of the high dielectric layer 123e in the first direction (the x-direction). An inner side surface of each of the spacers 130e may have a step.

In the MOSFET device 100e of the present embodiment, a lower surface of the first metal layer 125e and an inner bottom surface of the high dielectric layer 123e in contact therewith may form a first interface, and the lower surface of the WFC layer 127e may form a second interface. In addition, the second interface may be longer than the first interface in the first direction (the x-direction), which is the length direction of a channel. Accordingly, in the MOSFET device 100e of the present embodiment, the concentrations of the WFC material on the first interface may be uniform (e.g., uniform along the first direction (the x-direction)), and the GWR phenomenon may not occur in a gate structure 120e or may be improved.

Figure 10A:
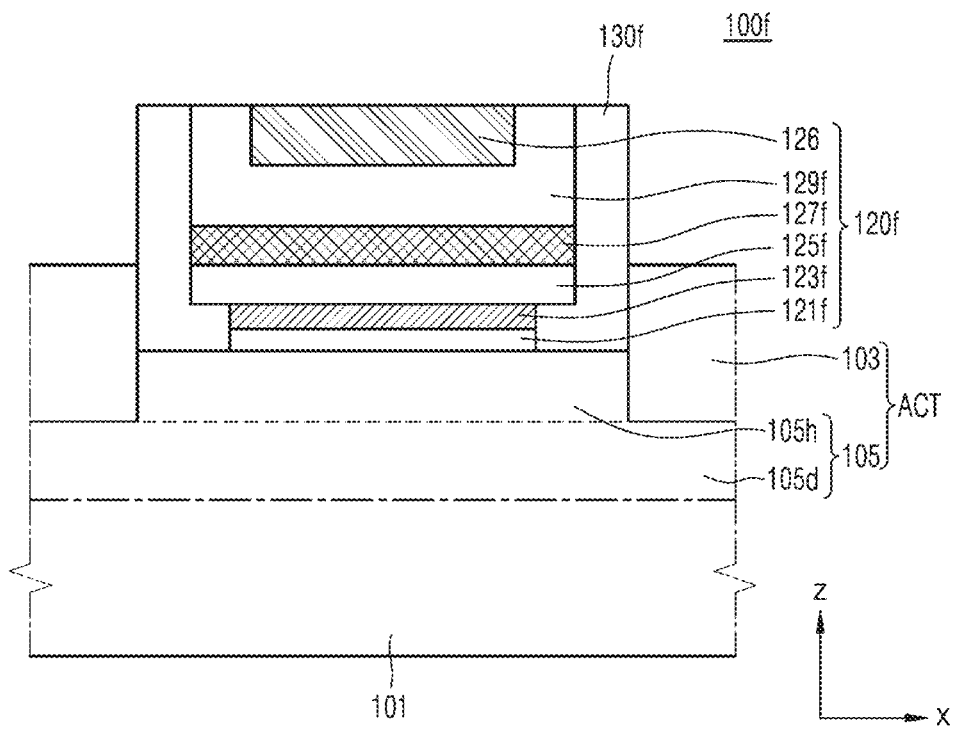
FIGS. 10A and 10B are cross-sectional views of a MOSFET device according to some embodiments of the inventive concept.
Figure 10B:
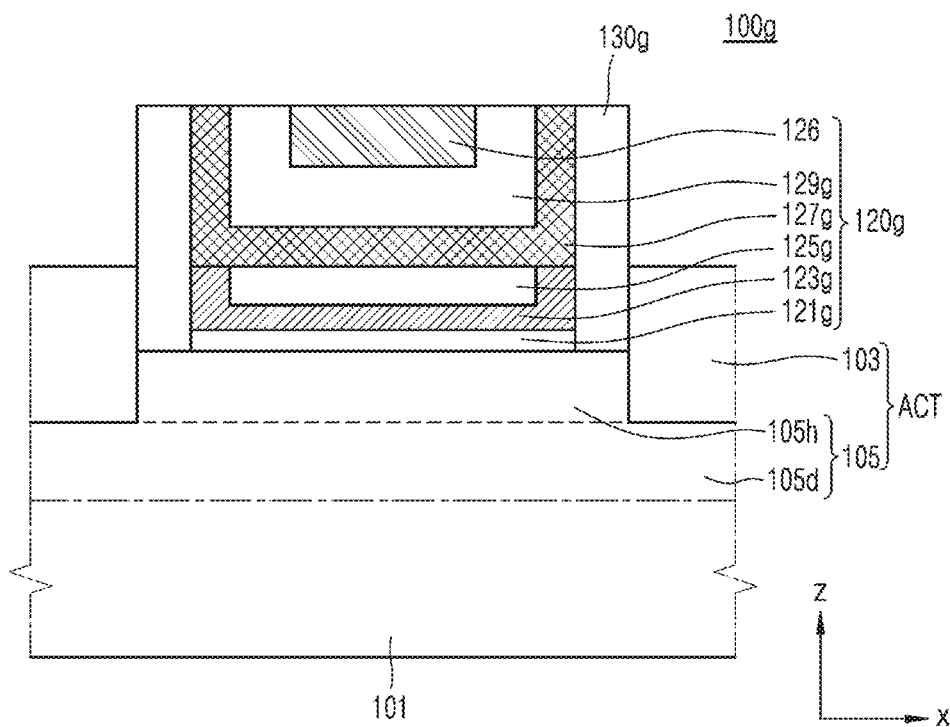

FIGS. 10A and 10B are cross-sectional views of MOSFET devices according to some embodiments of the inventive concept, which are cross-sectional views corresponding to FIG. 2B. Descriptions already given with respect to FIGS. 1 to 2C, 6A, 6B, and 9A to 9D are briefly given or omitted below.

Referring to FIG. 10A, a MOSFET device 100f of the present embodiment may be different from the MOSFET device 100 of FIG. 1 in that a second metal layer 129f has a U-shape and further includes a gap-fill layer 126 therein. In detail, in the MOSFET device 100f of the present embodiment, the second metal layer 129f may have a U-shape covering a lower surface of the gap-fill layer 126 and both side surfaces of the gap-fill layer 126, which are spaced apart from each other in the first direction (the x-direction). Due to the U-shape of the second metal layer 129f, an upper surface of the gap-fill layer 126, upper surfaces of protruding portions of the second metal layer 129f on both sides of the second metal layer 129f, and upper surfaces of spacers 130f may be on substantially the same plane.

The gap-fill layer 126 may be arranged on the second metal layer 129f and may include, for example, tungsten (W). However, a material of the gap-fill layer 126 is not limited to tungsten. The gap-fill layer 126 may include various metals suitable for filling a gap. For example, the gap-fill layer 126 may include a material selected from a group including a metal nitride such as TiN, TaN, or the like, Al, a metal carbide, a metal silicide, a metal aluminum carbide, a metal aluminum nitride, and a metal silicon nitride. For reference, when a gate structure 120f is formed in a replacement metal gate (RMG) structure, the gap-fill layer 126 may be a metal layer that finally fills a remaining gap. Accordingly, when the second metal layer 129f is sufficiently thick, the gap-fill layer 126 may be omitted. Each of the spacers 130f may include a step in an inner side surface thereof.

In the MOSFET device 100f of the present embodiment, a first interface and a second interface may have substantially the same shape as the first interface and the second interface of the MOSFET device 100 of FIG. 1. Accordingly, in the MOSFET device 100f of the present embodiment, the concentrations of the WFC material on the first interface may be uniform (e.g., uniform along the first direction (the x-direction)), and the GWR phenomenon may not occur in a gate structure 120f or may be improved.

Referring to FIG. 10B, a MOSFET device 100g of the present embodiment may be different from the MOSFET device 100a of FIG. 6A in that a second metal layer 129g has a U-shape and further includes the gap-fill layer 126 therein. In detail, in the MOSFET device 100g of the present embodiment, the second metal layer 129g may be arranged in a WFC layer 127g having a U-shape, and may have a U-shape covering a lower surface of the gap-fill layer 126 and both side surfaces of the gap-fill layer 126, which are spaced apart from each other in the first direction (the x-direction). Due to the U-shape of the WFC layer 127g and the U-shape of the second metal layer 129g, an upper surface of the gap-fill layer 126, upper surfaces of protruding portions of the second metal layer 129g on both sides of the second metal layer 129g, upper surfaces of protruding portions of the WFC layer 127g on both sides of the WFC layer 127g, and upper surfaces of spacers 130g may be on substantially the same plane. The gap-fill layer 126 is as described as the gap-fill layer 126 in the MOSFET device 100f of FIG. 10A. Each of the spacers 130g may not have a step in an inner side surface thereof.

In the MOSFET device 100g of the present embodiment, a first interface and a second interface may have substantially the same shape as the first interface and the second interface of the MOSFET device 100a of FIG. 6A. Accordingly, in the MOSFET device 100g of the present embodiment, the concentrations of the WFC material on the first interface may be uniform (e.g., uniform along the first direction (the x-direction)), and the GWR phenomenon may not occur in a gate structure 120g or may be improved.

Figure 11A:
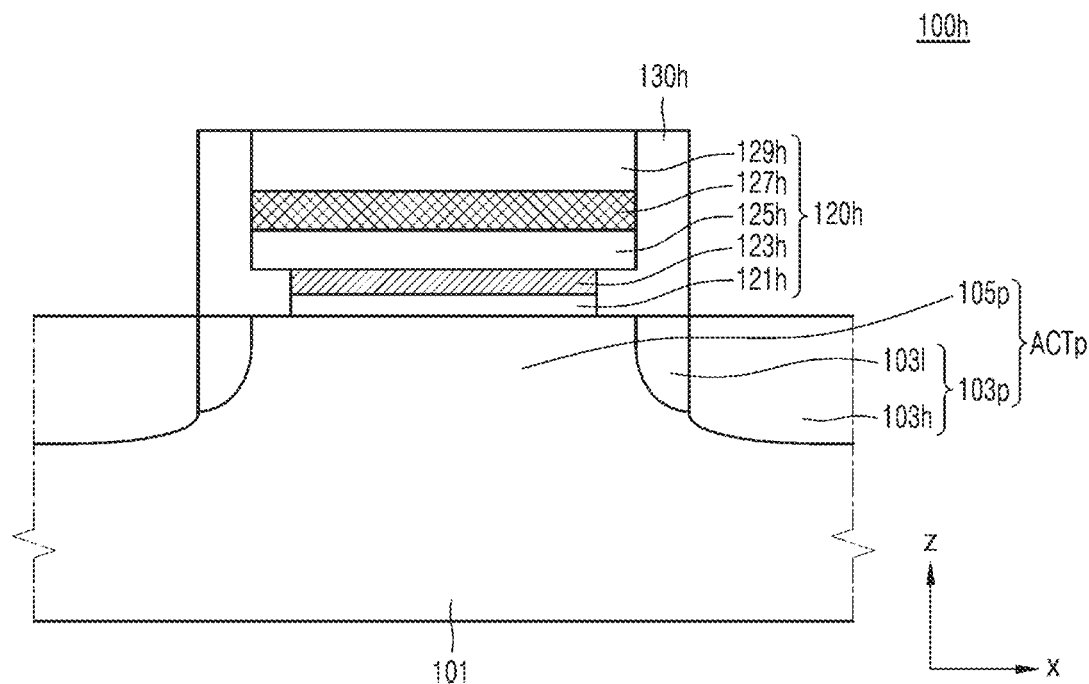
FIGS. 11A and 11B are cross-sectional views of a MOSFET device according to some embodiments of the inventive concept.
Figure 11B:
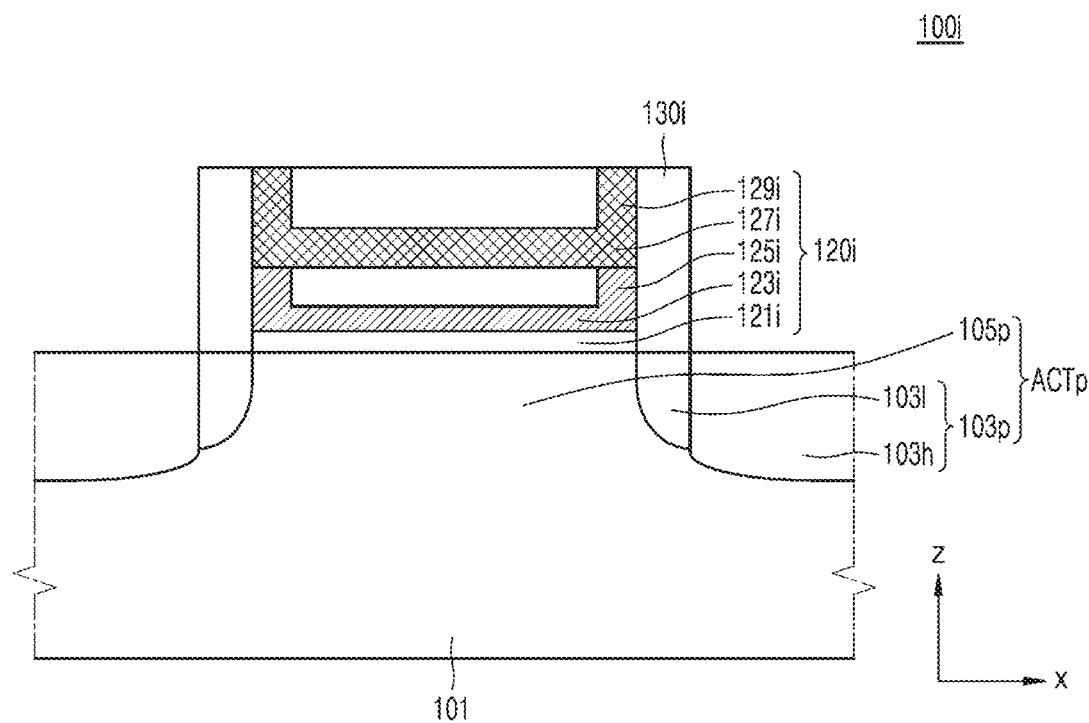

FIGS. 11A and 11B are cross-sectional views of MOSFET devices according to some embodiments, which are cross-sectional views corresponding to FIG. 2B. Descriptions already given with respect to FIGS. 1 to 2C, 6A, 6B, 9A to 9D, 10A, and 10B are briefly given or omitted below.

Referring to FIG. 11A, a MOSFET device 100h of the present embodiment may be different from the MOSFET device 100 of FIG. 1 in that the MOSFET device 100h has a planar structure (e.g., a planar channel region) instead of a fin structure. In detail, the MOSFET device 100h may include the semiconductor substrate 101, an active area ACTp, and a gate structure 120h. The semiconductor substrate 101 and the gate structure 120h are similar to or the same as those described with reference to the MOSFET device 100 of FIG. 1. However, the semiconductor substrate 101 and the gate structure 120h may be different from the semiconductor substrate 101 and the gate structure 120 of the MOSFET device 100 of FIG. 1 in that no fin is formed on the semiconductor substrate 101, and thus, the gate structure 120h does not cover the fin.

The active area ACTp may be defined by a device isolation film and may extend on the semiconductor substrate 101 in the first direction (the x-direction). The gate structure 120h may cross the active area ACTp on the semiconductor substrate 101 and extend in the second direction (the y-direction). The active area ACTp may include an impurity area formed by injecting impurity ions into the semiconductor substrate 101 at a high concentration. For example, the active area ACTp may include source/drain areas 103p formed by injecting impurity ions at a high concentration into an upper area of the semiconductor substrate 101 on both sides of the gate structure 120h, and a channel area 105p below the gate structure 120h. Each of the source/drain areas 103p may include a high concentration doped area 103h and a low concentration doped area 103l.

In the MOSFET device 100h of the present embodiment, the gate structure 120h may have a planar structure in which internal layers have a uniform thickness (e.g., a uniform thickness in the third direction (z-direction) along the first direction (the x-direction)) and are sequentially stacked in the third direction (the z-direction). As shown in FIG. 11A, a vertical cross-sectional structure of the gate structure 120h may be substantially the same as a cross-sectional structure of the gate structure 120 of the MOSFET device 100 of FIG. 2B. Accordingly, like the first interface and the second interface of the MOSFET device 100 of FIG. 1, in a first interface and a second interface of the MOSFET device 100h of the present embodiment, the second interface may be longer than the first interface in the first direction (the x-direction). As a result, in the MOSFET device 100h of the present embodiment, the concentrations of the WFC material on the first interface may be uniform (e.g., uniform along the first direction (the x-direction)), and the GWR phenomenon may not occur in a gate structure 120h or may be improved. Each of spacers 130h may have a step in an inner side surface thereof.

Referring to FIG. 11B, a MOSFET device 100i may be different from the MOSFET device 100a of FIG. 6 in that the MOSFET device 100i has a planar structure instead of a fin structure. In detail, the MOSFET device 100i of the present embodiment may include the semiconductor substrate 101, the active area ACTp, and a gate structure 120i. The semiconductor substrate 101, the active area ACTp, and the gate structure 120i are as described in the MOSFET device 100 of FIG. 6A and the MOSFET device 100h of FIG. 11A.

In the MOSFET device 100i of the present embodiment, the gate structure 120i may have a planar structure in which internal layers have a uniform thickness (e.g., a uniform thickness in the third direction (z-direction) along the first direction (the x-direction)) and are sequentially stacked in the third direction (the z-direction). As shown in FIG. 11B, a vertical cross-sectional structure of the gate structure 120i may be substantially the same as a cross-sectional structure of the gate structure 120a of the MOSFET device 100a of FIG. 6A. Accordingly, like the first interface and the second interface of the MOSFET device 100a of FIG. 6A, in a first interface and a second interface of the MOSFET device 100i of the present embodiment, the first interface may be longer than the second interface in the first direction (the x-direction). As a result, in the MOSFET device 100i of the present embodiment, the concentrations of the WFC material on the first interface may be uniform (e.g., uniform along the first direction (the x-direction)), and the GWR phenomenon may not occur in the gate structure 120i or may be improved. Each of spacers 130i may not have a step in an inner side surface thereof.

MOSFET devices of various structures have been described. However, the inventive concept is not limited to the structures of the MOSFET devices described herein. For example, the inventive concept may extend to all MOSFET devices including a gate structure in which a second interface is longer than a first interface in a length direction of a channel.

FIGS. 12A to 12H are cross-sectional views schematically illustrating methods of manufacturing the MOSFET device 100 of FIG. 1, according to some embodiments of the inventive concept. It will be described below with reference to FIGS. 1 to 2C, and descriptions already given with respect to FIGS. 1 to 2C are briefly given or omitted below.

Figure 12A:
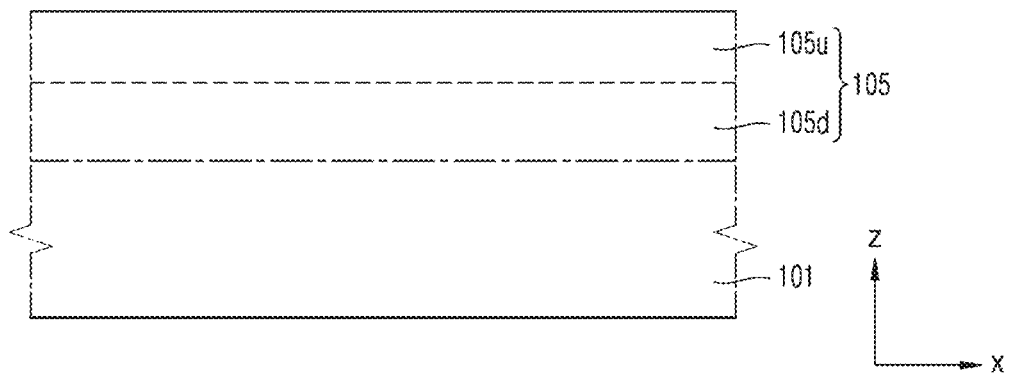
FIGS. 12A to 12H are cross-sectional views schematically illustrating a method of manufacturing the MOSFET device of FIG. 1, according to some embodiments of the inventive concept.

Referring to FIG. 12A, in methods of manufacturing a MOSFET device of the present embodiment, first, an upper portion of the semiconductor substrate 101 is etched to form the fin 105 having a structure protruding from the semiconductor substrate 101. The fin 105 may be formed in a structure extending in the first direction (the x-direction) on the semiconductor substrate 101. The fin 105 may include the lower fin portion 105d and the upper fin portion 105u.

Figure 12B:
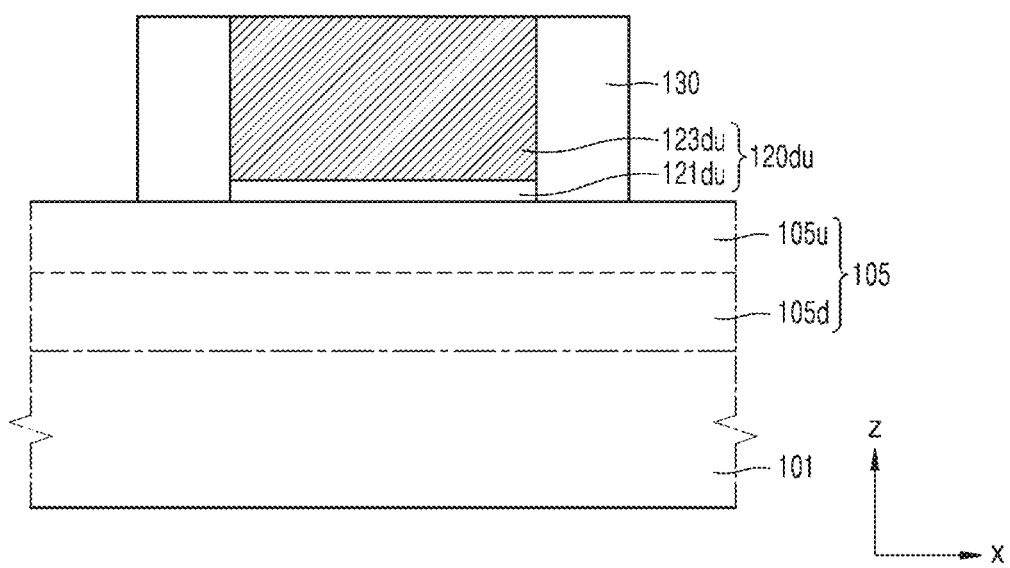

Referring to FIG. 12B, after forming the fin 105, the device isolation film 110 (e.g., the device isolation film 110 in FIG. 2C) covering a lower portion of both opposing side surfaces of the fin 105 is formed. The opposing side surfaces of the lower fin portion 105d of the fin 105 are spaced apart from each other in the second direction (the y-direction). After forming the device isolation film 110, only the upper fin portion 105u of the fin 105 may have a structure protruding from the device isolation film 110.

After the device isolation film 110 is formed, a dummy gate structure 120du including a dummy insulating film 121du and a dummy gate electrode 123du is formed, and the spacers 130 are formed on both side surfaces of the dummy gate structure 120du. The dummy gate structure 120du and the spacers 130 may be formed in, for example, a structure extending in the second direction (the y-direction) while covering a portion of the fin 105. In detail, the dummy gate structure 120du and the spacers 130 may have a structure surrounding an upper surface and side surface portions of the upper fin portion 105u of the fin 105 on the device isolation film 110 as illustrated in FIG. 2C.

Figure 12C:
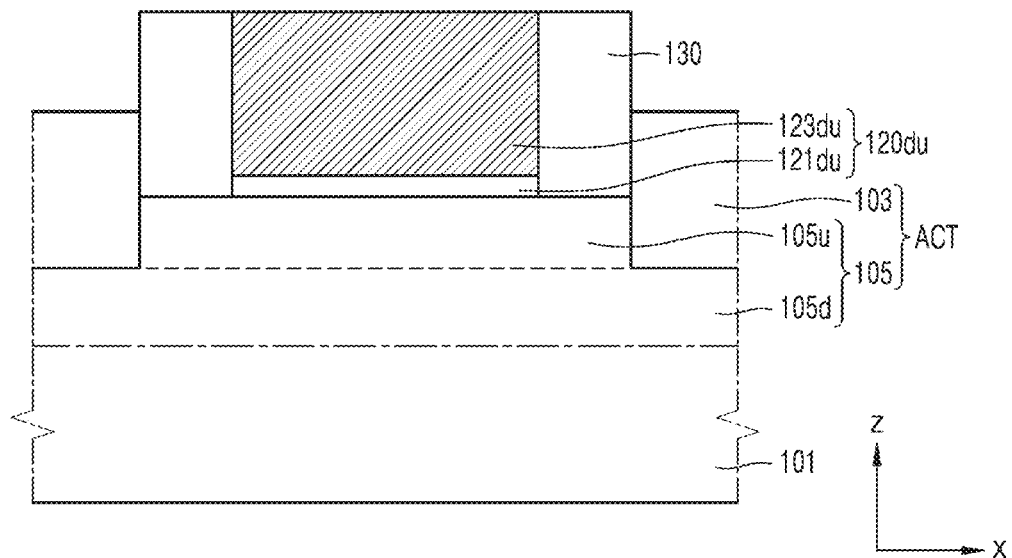

Referring to FIG. 12C, portions of the upper fin portion 105u protruding above the device isolation film 110, which are adjacent side surfaces of the dummy gate structure 120du are removed, and the source/drain areas 103 are formed on the lower fin portion 105d by growing an epitaxial film. The source/drain areas 103 may include, for example, at least one of SiGe, Ge, Si, and SiC epitaxially grown on the lower fin portion 105d.

As shown in FIG. 12C, upper surfaces of the source/drain areas 103 may be higher than an upper surface of the upper fin portion 105u below the dummy gate structure 120du. In addition, the source/drain areas 103 may cover a lower portion of the spacers 130. In some embodiments, the upper fin portion 105u may not be removed, and the source/drain areas 103 may be formed on the upper fin portion 105u. In this case, the source/drain areas 103 may maintain an initial shape of the upper fin portion 105u, or may be formed on the upper fin portion 105u through epitaxial growth to have a different shape from the initial shape of the upper fin portion 105u.

Figure 12D:
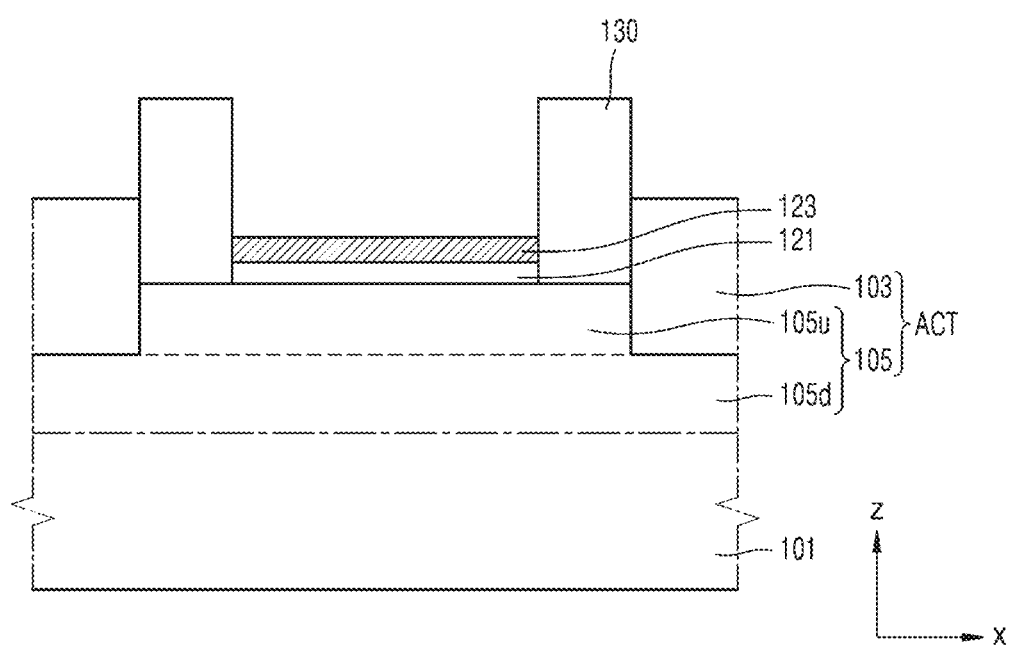

Referring to FIG. 12D, after the source/drain areas 103 are formed, an insulating film covering resultants on the substrate 101 is formed and planarized to form an interlayer insulating film (not shown). After the interlayer insulating film is formed, the dummy gate structure 120du is removed. In the removal of the dummy gate structure 120du, only the dummy gate electrode 123du may be removed, or the dummy insulating film 121du may be removed together. When the dummy insulating film 121du (e.g., a portion of the dummy insulating film 121du) remains, the dummy insulating film 121du may be used as the interface layer 121.

Then, the high dielectric layer 123 is formed on the interface layer 121 between two spacers 130. The high dielectric layer 123 is formed through an anisotropic deposition method in which the high dielectric layer 123 is not deposited on an inner side surface of the two spacers 130 but is deposited only on an upper surface of a layer therebelow. Accordingly, the high dielectric layer 123 may have a uniform thickness in the third direction (z-direction) along the first direction (the x-direction). When the dummy insulating film 121du is also removed from the dummy gate structure 120du, before forming the high dielectric layer 123, the interface layer 121 may be separately formed through the anisotropic deposition method.

Figure 12E:
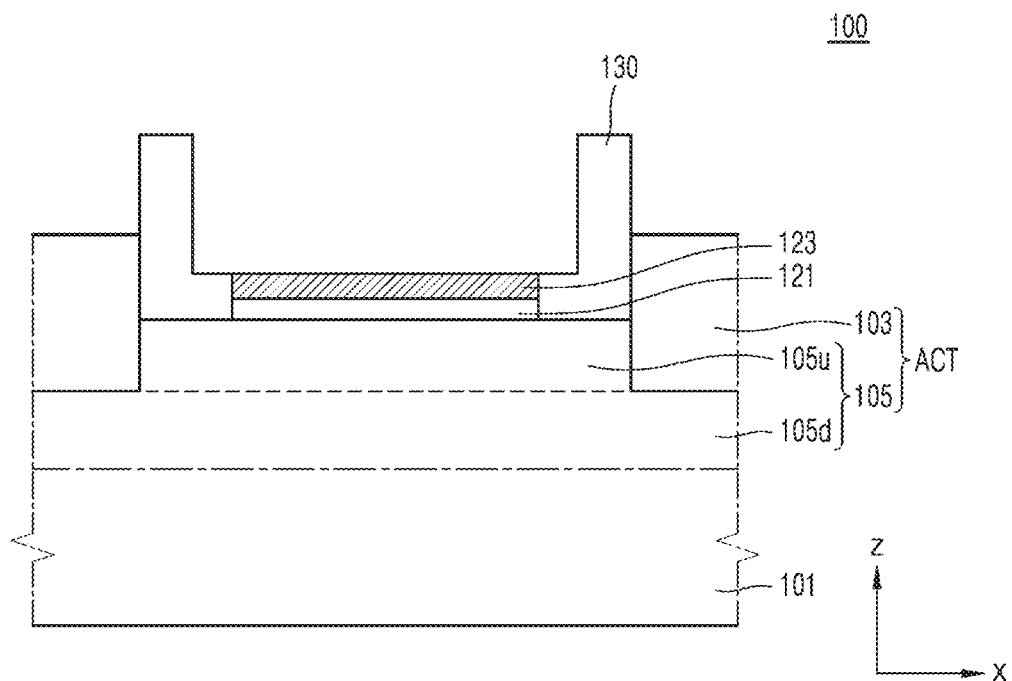

Referring to FIG. 12E, inner side surfaces of the two spacers 130, which are adjacent to each other, are etched to increase a distance between the two spacers 130 in the first direction (the x-direction). An operation of etching the inner side surfaces of the two spacers 130 may be an operation of securing a space for the first metal layer 125, the WFC layer 127, and the second metal layer 129, which have a longer length than the high dielectric layer 123 in the first direction (the x-direction).

The etching of the inner side surfaces of the two spacers 130 may be performed, for example, through an etchback operation. The etching of the inner side surfaces of the two spacers 130 is not limited to the etchback operation. During the etching of the inner side surfaces of the two spacers 130, a portion of an upper portion of the two spacers 130 may be removed. In some embodiments, a portion of the high dielectric layer 123 may also be removed.

Figure 12F:
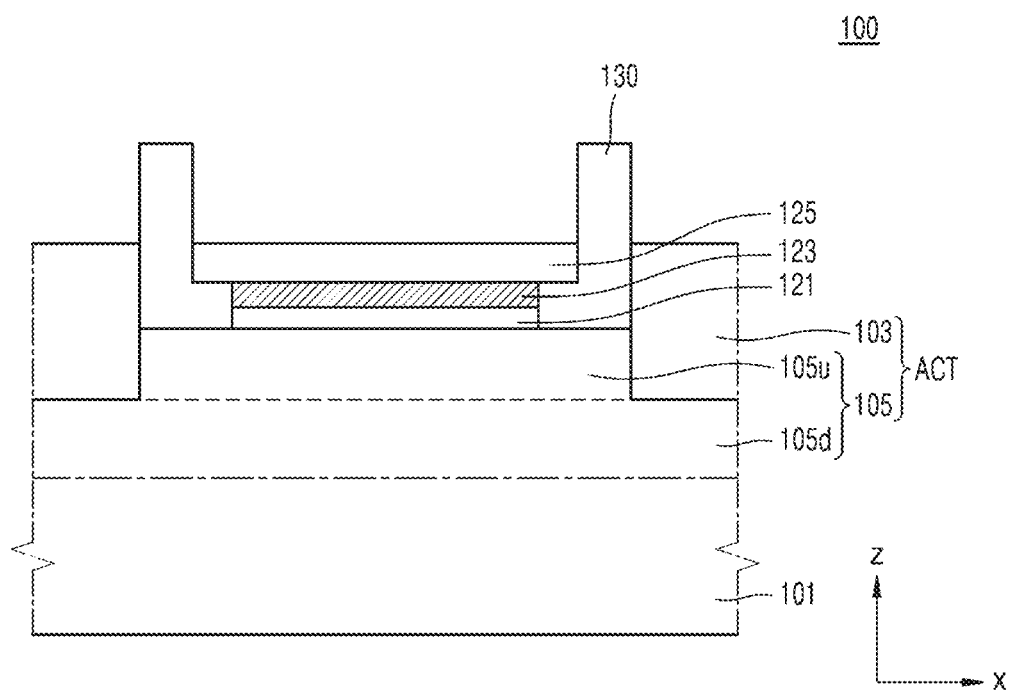

Referring to FIG. 12F, after etching the inner side surfaces of the two spacers 130, the first metal layer 125 is formed on the high dielectric layer 123 between the two spacers 130. The first metal layer 125 may be formed through the anisotropic deposition method in which the first metal layer 125 is not deposited on the inner side surfaces of the two spacers 130 but is only deposited on the high dielectric layer 123. Even when the anisotropic deposition method is performed, the first metal layer 125 may be deposited on inner bottom surfaces of the two spacer 130s. Accordingly, as shown in FIG. 12F, the first metal layer 125 may be longer than the high dielectric layer 123 in the first direction (the x-direction).

Figure 12G:
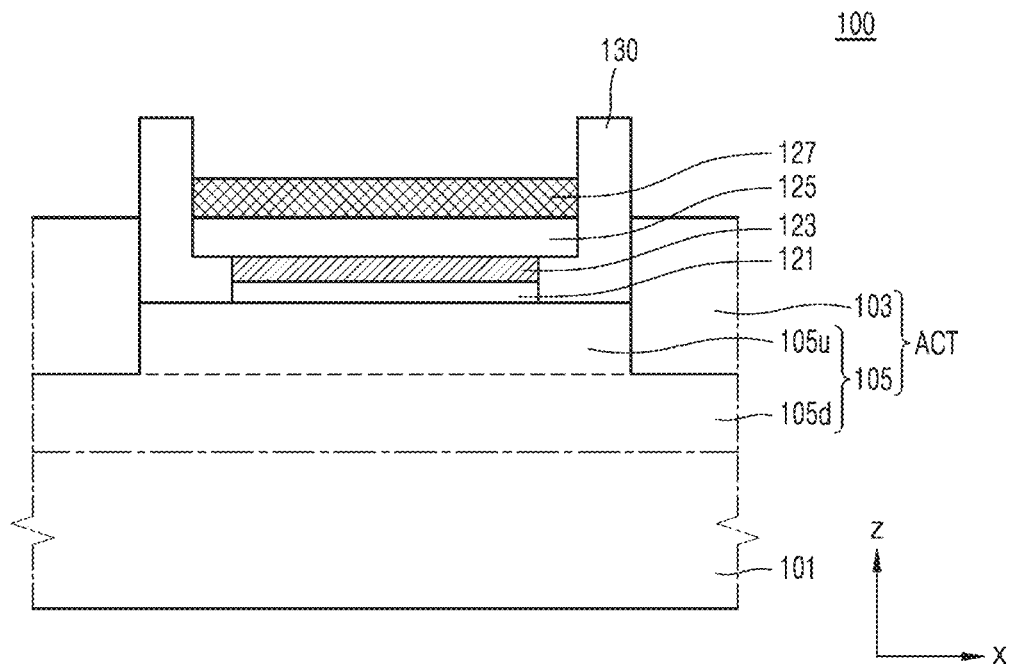
Figure 12H:
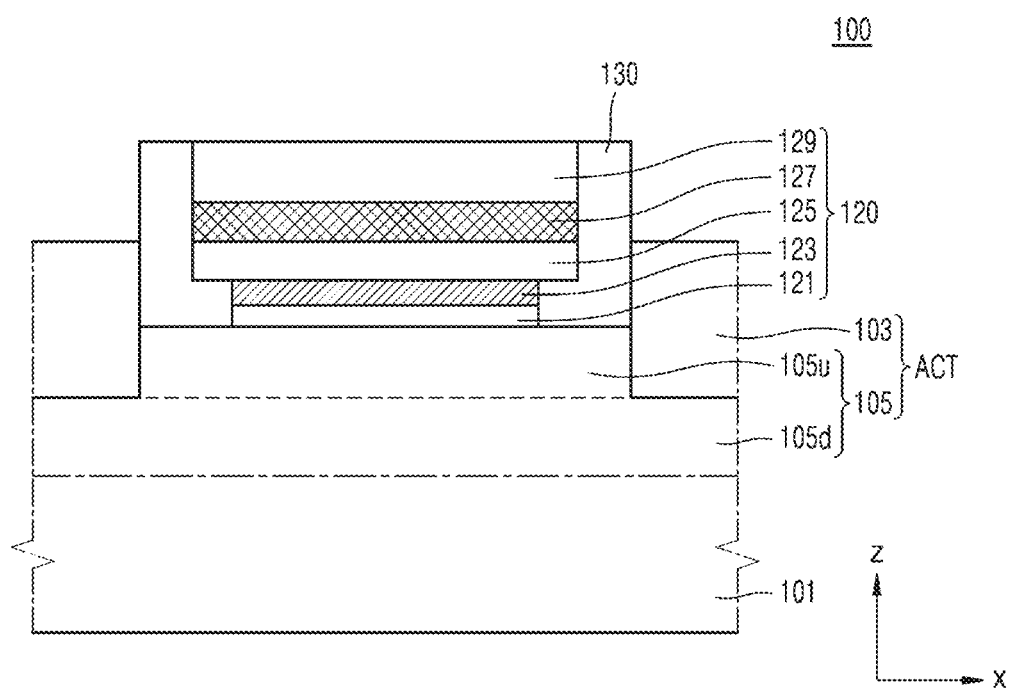

Referring to FIGS. 12G and 12H together, subsequently, the WFC layer 127 is formed on the first metal layer 125 between the two spacers 130 adjacent to each other. The WFC layer 127 may be formed through the anisotropic deposition method in which the WFC layer 127 is not deposited on the inner side surfaces of the two spacers 130 but is only deposited on the first metal layer 125.

After the WFC layer 127 is formed, the second metal layer 129 is formed on the WFC layer 127. The second metal layer 129 may be formed through the anisotropic deposition method or may be formed through an isotropic or conformal deposition method. When the second metal layer 129 is formed through the conformal deposition method, after depositing a metal material forming the second metal layer 129, the second metal layer 129 may be formed through a planarization operation exposing the upper surfaces of the two spacers 130.

The MOSFET device 100 of FIG. 1 may be completed through the formation of the second metal layer 129. In the manufacturing method of the MOSFET device of the present embodiment, the MOSFET device 100 of FIG. 1, in which the second interface is longer than the first interface in the first direction (the x-direction), may be easily manufactured by performing an operation of increasing a distance between inner side surfaces of the two spacers 130 in the first direction (the x-direction) and then forming the first metal layer 125 and the WFC layer 127 through the anisotropic deposition method.

Figure 13A:
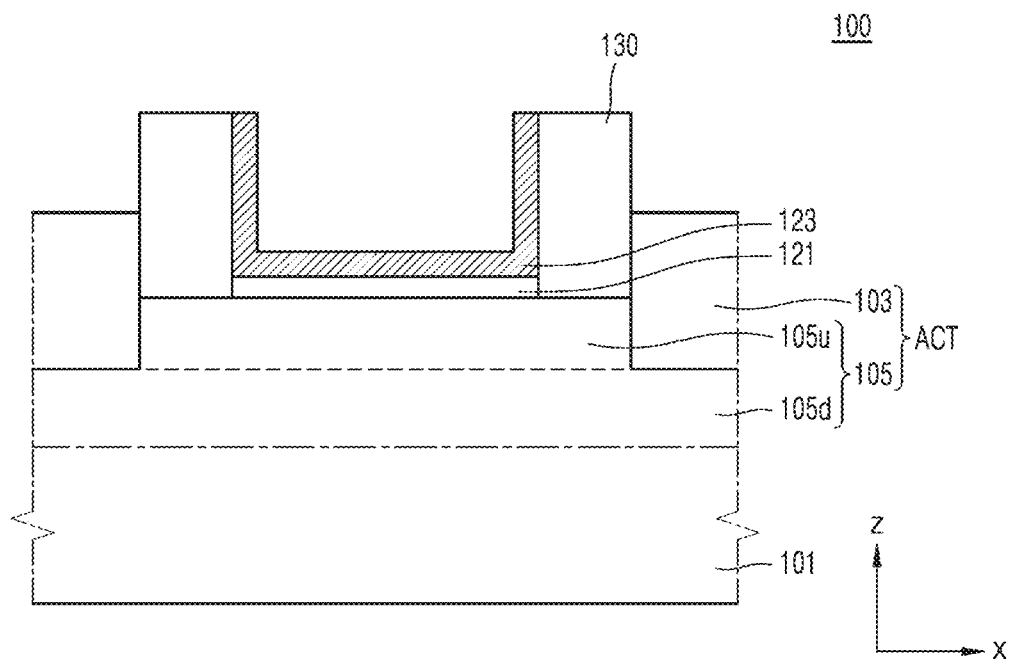
FIGS. 13A and 13B are cross-sectional views schematically illustrating a method of manufacturing the MOSFET device of FIG. 1, according to some embodiments of the inventive concept.
Figure 13B:
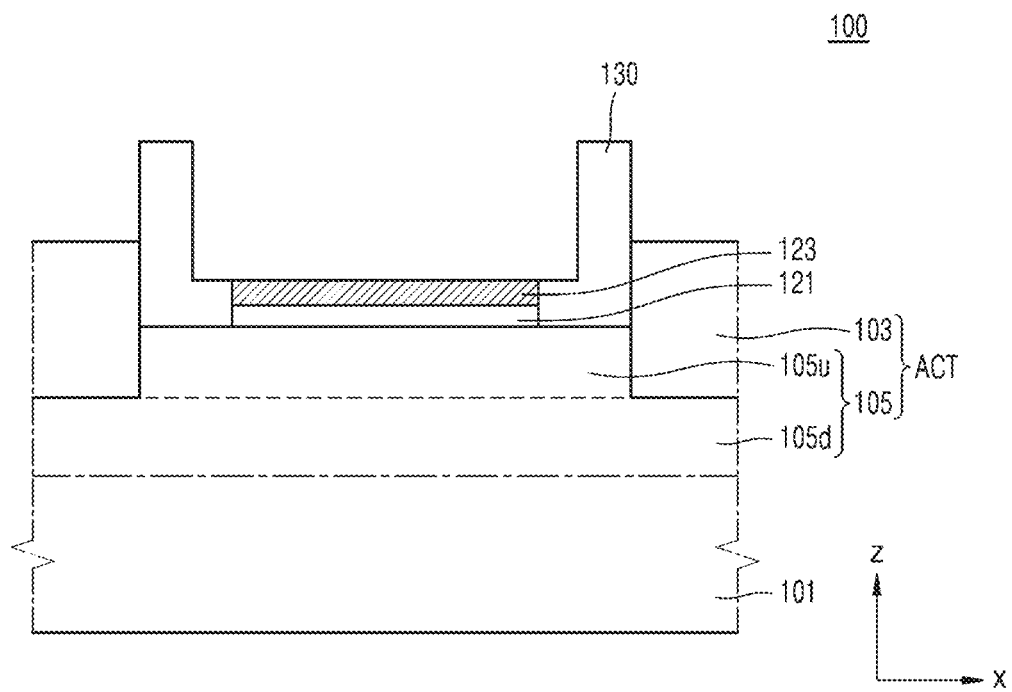

FIGS. 13A and 13B are cross-sectional views schematically illustrating a manufacturing operation of the MOSFET device 100 of FIG. 1, according to some embodiments. It will be described below with reference to FIGS. 1 to 2C, and descriptions already given with respect to FIGS. 12A to 12H are briefly given or omitted below.

Referring to FIG. 13A, in a manufacturing method of the MOSFET device of the present embodiment, first, the dummy gate structure 120du is removed, and then the high dielectric layer 123 is formed on the interface layer 121, through the operations of FIGS. 12A to 12D. In the manufacturing method of the MOSFET device of the present embodiment, the high dielectric layer 123 may be formed to have a uniform thickness on the upper surface of the interface layer 121 and the inner side surfaces of the two spacers 130 through the conformal deposition method instead of the anisotropic deposition method.

Referring to FIG. 13B, the inner side surfaces of the two spacers 130 which are adjacent to each other are etched to increase the distance between the two spacers 130 in the first direction (the x-direction). In the operation of etching the inner side surfaces of the two spacers 130, a portion of the high dielectric layer 123 on the inner side surfaces of the two spacers 130 may also be removed together. As a result, after the operation of etching the inner side surfaces of the two spacers 130, a structure substantially the same as the structure of FIG. 12E may be formed. Then, the MOSFET device 100 of FIG. 1 may be completed through operations of FIGS. 12F to 12H.

FIGS. 14A to 14E are cross-sectional views schematically illustrating methods of manufacturing the MOSFET device 100a of FIG. 6A, according to some embodiments of the inventive concept, which are cross-sectional views corresponding to FIG. 6B. It will be described below with reference to FIGS. 6A and 6B, and descriptions already given with respect to FIGS. 12A to 13B are briefly given or omitted below.

Figure 14A:
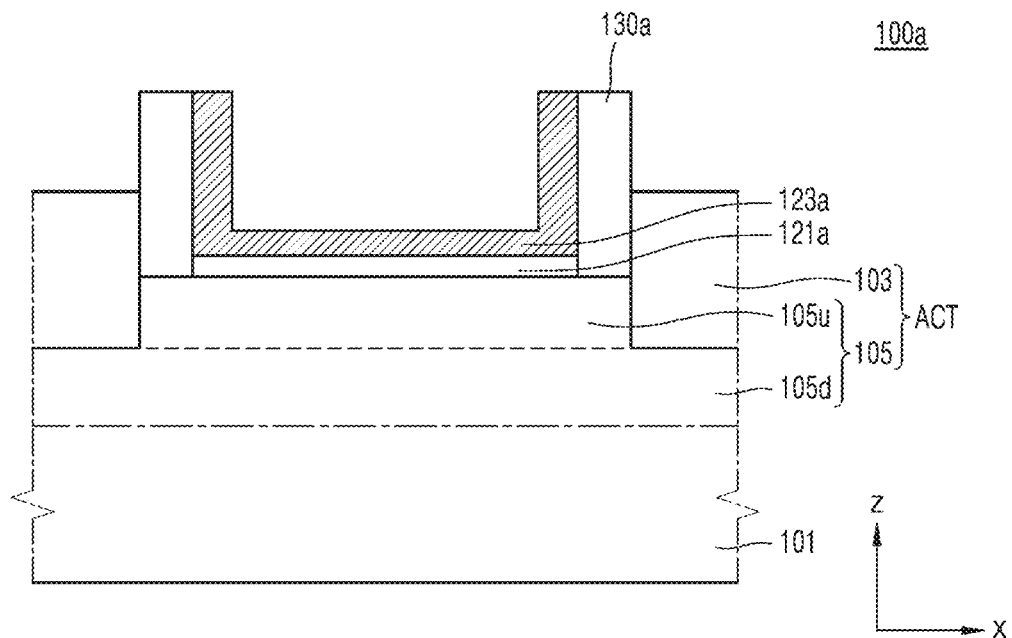
FIGS. 14A to 14E are cross-sectional views schematically illustrating a method of manufacturing the MOSFET device of FIG. 6A, according to some embodiments of the inventive concept.

Referring to FIG. 14A, in a manufacturing method of the MOSFET device of the present embodiment, first, the dummy gate structure 120du is removed, and the high dielectric layer 123a is formed on the interface layer 121a, through the operations of FIGS. 12A to 12D. The high dielectric layer 123a may be formed to have a uniform thickness on the upper surface of the interface layer 121a and the inner side surfaces of two spacers 130a through the conformal deposition method instead of the anisotropic deposition method. In some embodiments, the high dielectric layer 123a may have a first thickness on the upper surface of the interface layer 121a and may have a second thickness on the inner side surfaces of two spacers 130a as illustrated in FIG. 14A.

Figure 14B:
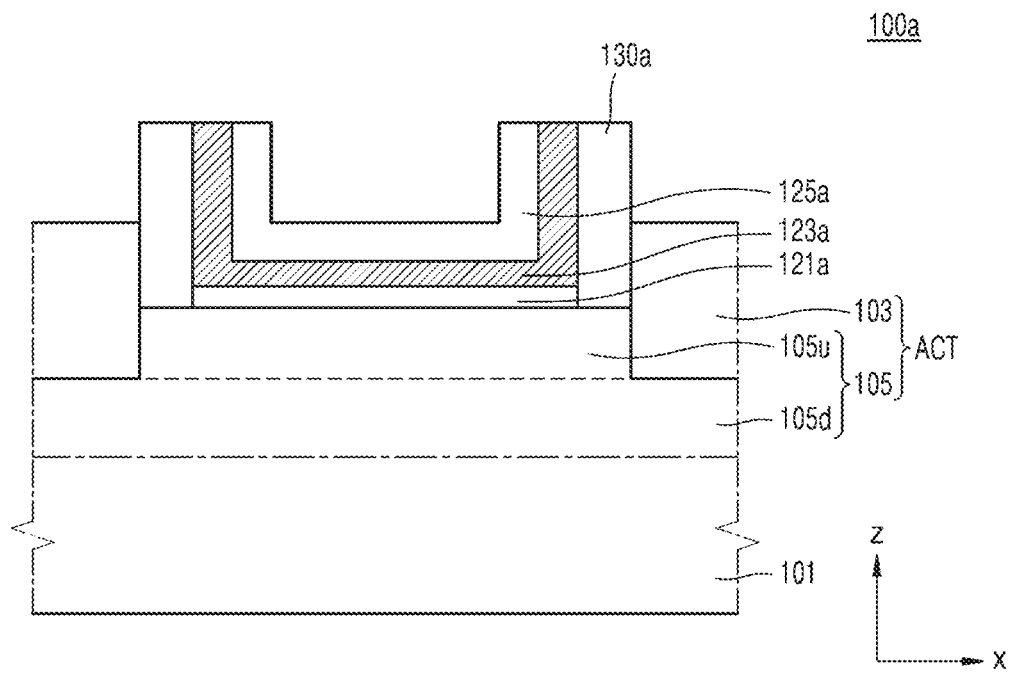

Referring to FIG. 14B, the first metal layer 125a is formed on the high dielectric layer 123a. The first metal layer 125a may be formed to have a uniform thickness on the upper surface and inner side surfaces of the high dielectric layer 123a through the conformal deposition method instead of the anisotropic deposition method.

Figure 14C:
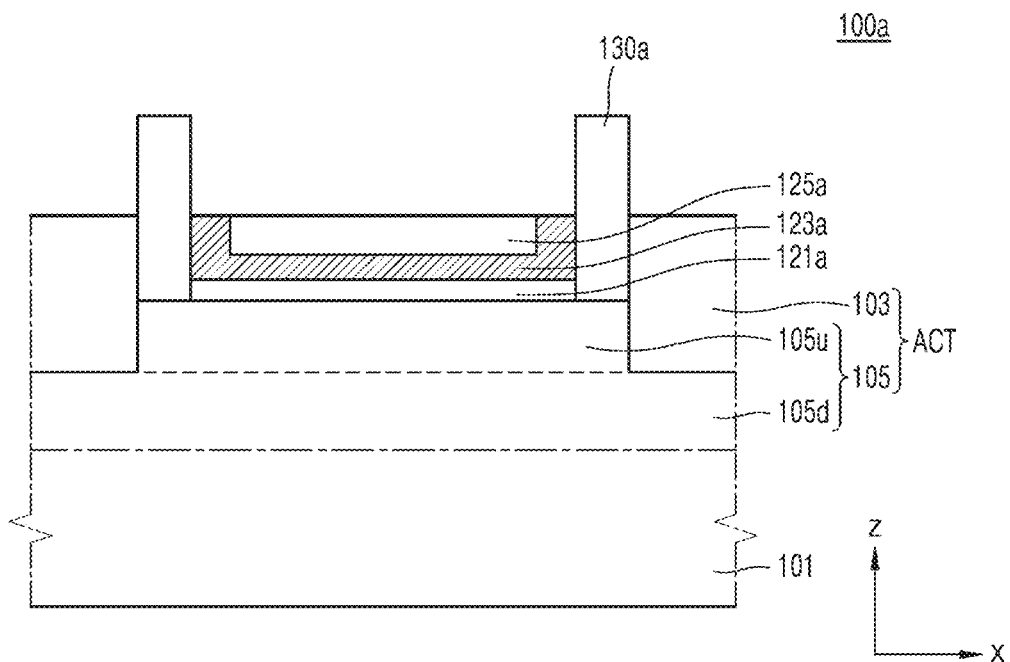

Referring to FIG. 14C, protruding portions of the high dielectric layer 123a and the first metal layer 125a are removed. Through the removal of the protruding portions, the high dielectric layer 123a may end up having a U-shape, and the first metal layer 125a may be maintained only in the U-shape of the high dielectric layer 123a. Accordingly, the high dielectric layer 123a may surround the lower surface and side surfaces of the first metal layer 125a, and the upper surface of the first metal layer 125a may be on substantially the same plane as the upper surfaces of the protruding portions of the high dielectric layer 123a.

Figure 14D:
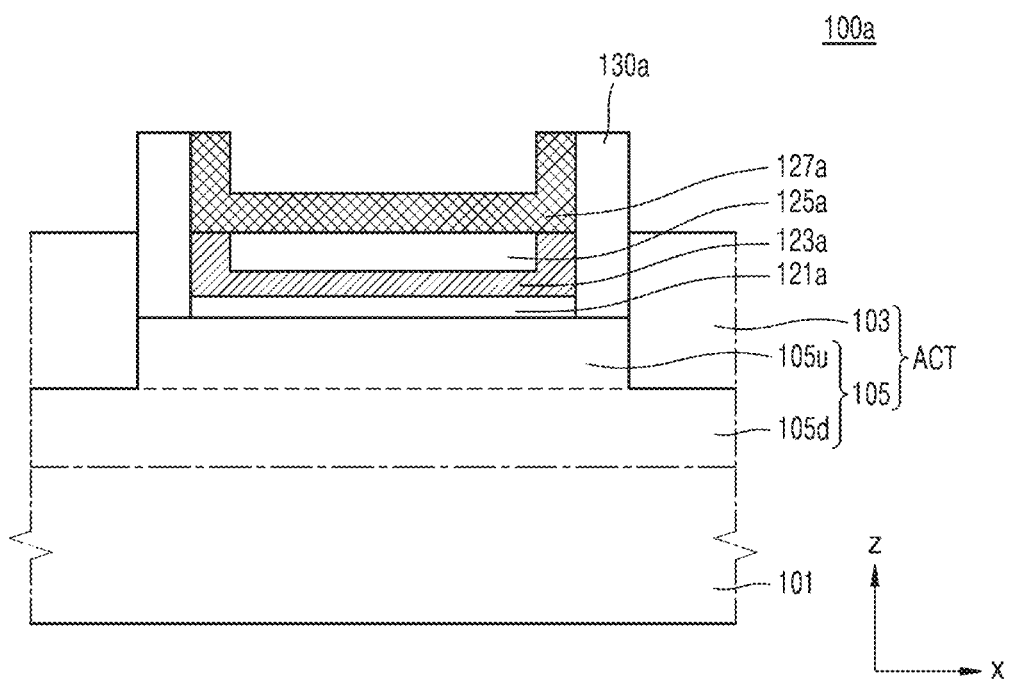

Referring to FIG. 14D, the WFC layer 127a is formed on the first metal layer 125a. The WFC layer 127a may be formed to have a uniform thickness on the upper surface of the first metal layer 125a, the upper surfaces of the protruding portions of the high dielectric layer 123a, and the inner side surfaces of the two spacers 130 through the conformal deposition method instead of the anisotropic deposition method.

Figure 14E:
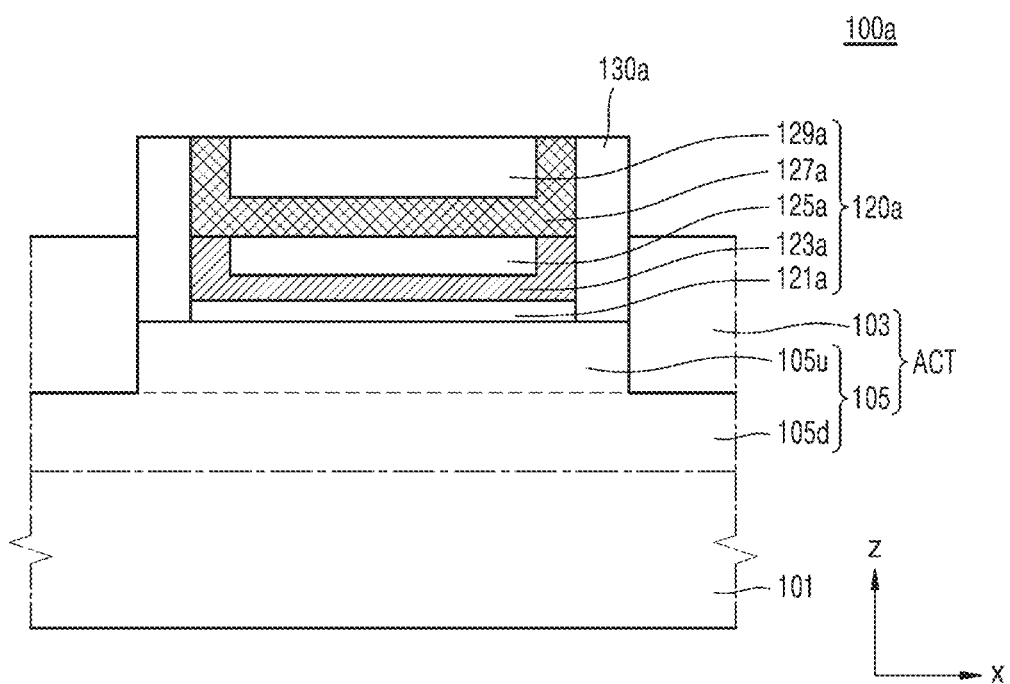

Referring to FIG. 14E, after the WFC layer 127a is formed, the second metal layer 129a is formed on the WFC layer 127a. The second metal layer 129a may be formed through the conformal deposition method. Accordingly, after depositing a metal material forming the second metal layer 129a, the second metal layer 129a may be formed through a planarization operation exposing the upper surfaces of the two spacers 130a.

The MOSFET device 100a of FIG. 6A may be completed through the formation of the second metal layer 129a. In the manufacturing method of the MOSFET device of the present embodiment, the MOSFET device 100a of FIG. 6A, in which the second interface is longer than the first interface in the first direction (the x-direction), may be easily manufactured by not performing a separate operation of increasing the distance between the inner side surfaces of the two spacers 130a and forming the high dielectric layer 123a, the first metal layer 125a, and the WFC layer 127a through the conformal deposition method, the removal of the protruding portions, or the like.

Figure 15A:
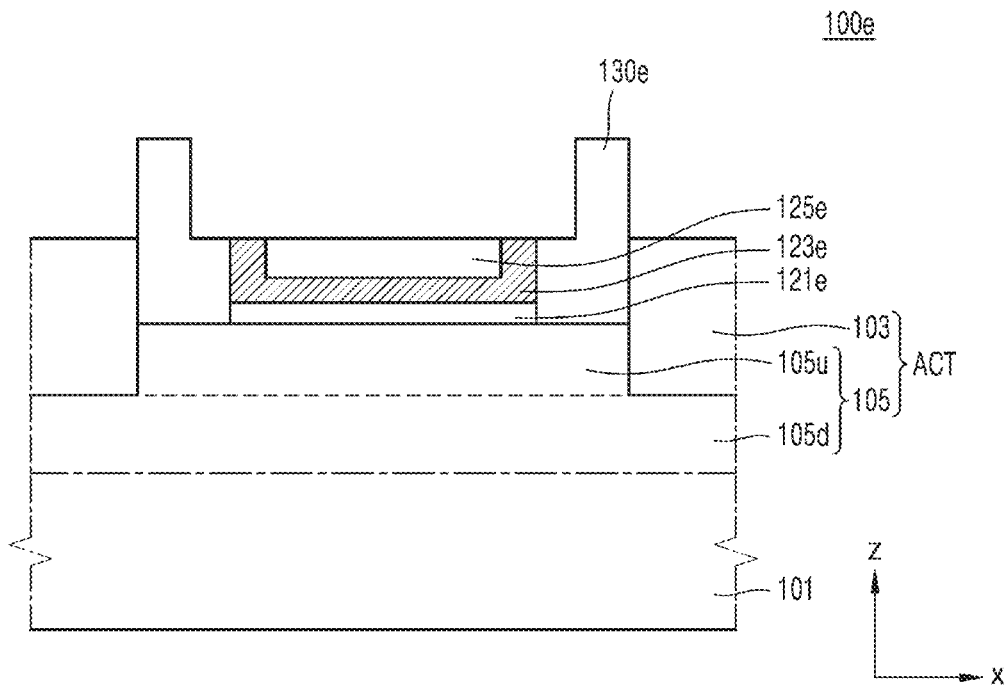
FIGS. 15A to 15B are cross-sectional views schematically illustrating a method of manufacturing the MOSFET device of FIG. 9D, according to some embodiments of the inventive concept.
Figure 15B:
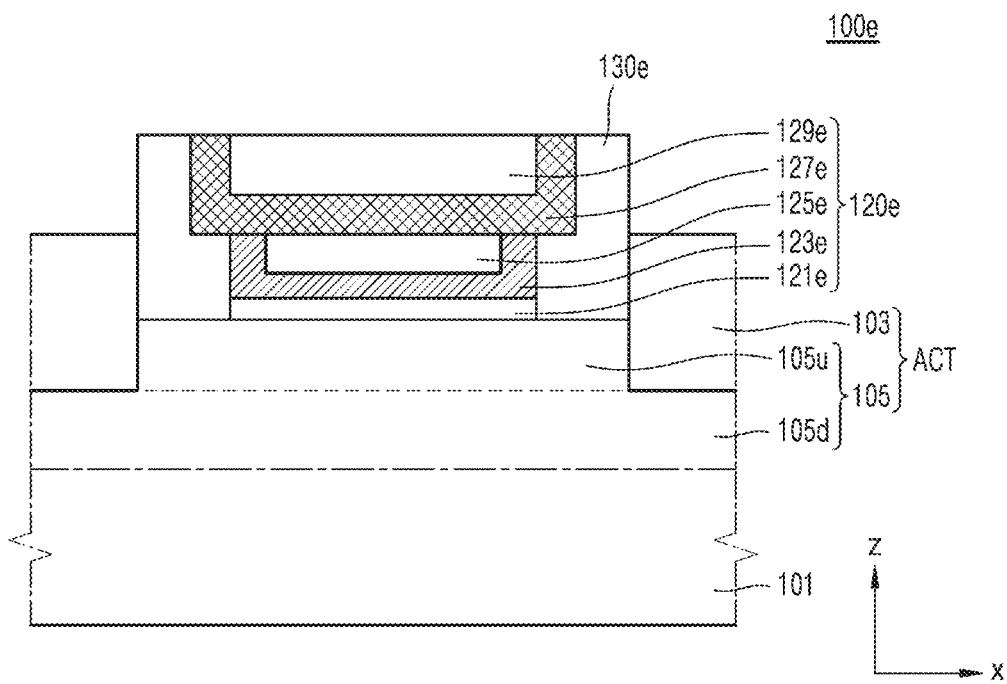

FIGS. 15A and 15B are cross-sectional views schematically illustrating methods of manufacturing the MOSFET device 100e of FIG. 9D, according to some embodiments of the inventive concept, which are cross-sectional views corresponding to FIG. 2B. It will be described below with reference to FIG. 9D, and descriptions already given with respect to FIGS. 12A to 14E are briefly given or omitted below.

Referring to FIG. 15A, in a manufacturing method of the MOSFET device of the present embodiment, the dummy gate structure 120du is removed through the operations of FIGS. 12A to 12D. Then, as in the operations of FIGS. 14A and 14B, the high dielectric layer 123e and the first metal layer 125e are formed on the interface layer 121e. The high dielectric layer 123e may be formed to have a uniform thickness on the upper surface of the interface layer 121e and the inner side surfaces of the two spacers 130e through the conformal deposition method, and in addition, the first metal layer 125e may be formed to have a uniform thickness on the upper surface and the inner side surfaces of the high dielectric layer 123e through the conformal deposition method.

Subsequently, the inner side surfaces of the two spacers 130e which are adjacent to each other are etched to increase the distance between the two spacers 130e in the first direction (the x-direction). In an operation of etching the inner side surfaces of the two spacers 130e, a portion of the high dielectric layer 123e and the first metal layer 125e on the inner side surfaces of the two spacers 130e may be removed together. In addition, the high dielectric layer 123e may become a U-shape, and the first metal layer 125e may be maintained only inside the U-shape of the high dielectric layer 123e.

Referring to FIG. 15B, the WFC layer 127e is formed on the first metal layer 125e. The WFC layer 127e may be formed to have a uniform thickness on the upper surface of the first metal layer 125e, the upper surfaces of the protruding portions of the high dielectric layer 123e, and inner bottom surfaces and the side surfaces of the two spacer 130e through the conformal disposition method.

After the WFC layer 127e is formed, the second metal layer 129e is formed on the WFC layer 127e. The second metal layer 129e may be formed through the conformal deposition method. Accordingly, after depositing a metal material forming the second metal layer 129e, the second metal layer 129e may be formed through the planarization operation exposing the upper surfaces of the two spacers 130e.

The MOSFET device 100e of FIG. 9D may be completed through the formation of the second metal layer 129e. In the manufacturing method of the MOSFET device of the present embodiment, the MOSFET device 100e of FIG. 9D, in which the second interface is longer than the first interface in the first direction (the x-direction), may be easily manufactured by performing the operation of removing the inner side surfaces of the two spacers 130 to increase the distance between the inner side surfaces of the two spacers 130e after the first metal layer 125e is formed, and forming the high dielectric layer 123e, the first metal layer 125e, and the WFC layer 127e through the conformal deposition method.

Although not described in detail, the MOSFET devices 100*b*, 100*c*, and 100*d* of FIGS. 9A to 9C may be easily manufactured by appropriately combining the anisotropic deposition or conformal deposition, the removing of the inner side surfaces of spacers, the removing of protruding portions of a layer, or the like.

While the inventive concept has been particularly shown and described with reference to example embodiments thereof, it will be understood that various changes in form and details may be made therein without departing from the scope of the following claims.

What is claimed is:

1. A metal oxide field-effect transistor (MOSFET) device comprising:
    a semiconductor substrate;
    an active area on the semiconductor substrate and extending in a first direction; and
    a gate structure on the semiconductor substrate, the gate structure extending across the active area in a second direction that traverses the first direction and comprising an interface layer, a high-k layer, a first metal layer, a work function control (WFC) layer, and a second metal layer, which are sequentially stacked on the active area, and each of the high-k layer, the first metal layer, the WFC layer, and the second metal layer comprising a lower surface facing the semiconductor substrate and an upper surface opposite the lower surface,
    wherein the lower surface of the WFC layer is longer than a first interface between the lower surface of the first metal layer and the upper surface of the high-k layer in the first direction.

2. The MOSFET device of claim 1, wherein the WFC layer comprises a WFC material, and a concentration of the WFC material on the first interface is uniform along the first direction.

3. The MOSFET device of claim 1, wherein each of the high-k layer, the first metal layer, and the WFC layer has a uniform thickness along the first direction,
    the high-k layer is shorter than the first metal layer in the first direction, and
    lengths of the first metal layer and the WFC layer in the first direction are substantially equal to each other.

4. The MOSFET device of claim 3, wherein the active area comprises a fin structure protruding from the semiconductor substrate, and the fin structure comprises side surfaces that are spaced apart from each other in the second direction,
    the gate structure extends on an upper surface of the fin structure and both the side surfaces of the fin structure, and the gate structure comprises side surfaces that are spaced apart from each other in the first direction,
    spacers are respectively on the side surfaces of the gate structure, and
    inner side surfaces of the spacers have respective steps adjacent the first interface.

5. The MOSFET device of claim 1, wherein each of the first metal layer and the second metal layer comprises side surfaces that are spaced apart from each other in the first direction,
    the high-k layer comprises a bottom portion extending on the lower surface of the first metal layer and protruding portions extending respectively on the side surfaces of the first metal layer,
    the WFC layer comprises a bottom portion extending on the lower surface of the second metal layer and protruding portions extending respectively on the side surfaces of the second metal layer, and
    the lower surface of the WFC layer is in contact with the upper surface of the first metal layer and upper surfaces of the protruding portions of the high-k layer.

6. The MOSFET device of claim 5, wherein the active area comprises a fin structure protruding from the semiconductor substrate, and the fin structure comprises side surfaces that are spaced apart from each other in the second direction,
    the gate structure extends on an upper surface of the fin structure and both the side surfaces of the fin structure, and the gate structure comprises side surfaces that are spaced apart from each other in the first direction,
    spacers are respectively on the side surfaces of the gate structure, and
    side surfaces of the interface layer, the high-k layer, and the WFC layer are coplanar with each other and are in contact with inner side surfaces of the spacers.

7. The MOSFET device of claim 1, wherein the WFC layer comprises aluminum (Al).

8. The MOSFET device of claim 1, wherein lengths of the first metal layer and the WFC layer are substantially equal to each other in the first direction, and the lower surface of the WFC layer forms a second interface with the upper surface of the first metal layer, and
    the second interface is longer than the first interface in the first direction.

9. The MOSFET device of claim 1, wherein the gate structure comprises side surfaces that are spaced apart from each other in the first direction, and
    the MOSFET device further comprises spacers that are respectively on the side surfaces of the gate structure, inner side surfaces of the spacers each have a step or a planar shape adjacent the first interface.

10. A metal oxide field-effect transistor (MOSFET) device comprising:
    a semiconductor substrate;
    an active area protruding from the semiconductor substrate and extending in a first direction;
    a gate structure on the semiconductor substrate, the gate structure extending in a second direction that traverses the first direction and covering at least a portion of the active area, the gate structure comprising an interface layer, a high-k layer, a first metal layer, a work function control (WFC) layer, and a second metal layer, which are sequentially stacked on the active area, and each of the high-k layer, the first metal layer, the work function control (WFC) layer, and the second metal layer comprising a lower surface facing the semiconductor substrate and an upper surface opposite the lower surface; and
    source and drain areas respectively on side surfaces of the gate structure, the side surfaces of the gate structure being spaced apart from each other in the first direction,
    wherein the lower surface of the WFC layer is longer than a first interface between the lower surface of the first metal layer and the upper surface of the high-k layer in the first direction.

11. The MOSFET device of claim 10, wherein each of the high-k layer, the first metal layer, and the WFC layer has a uniform thickness along the first direction,
    the high-k layer is shorter than the first metal layer in the first direction,
    lengths of the first metal layer and the WFC layer are substantially equal to each other in the first direction, and the lower surface of the WFC layer forms a second interface with the upper surface of the first metal layer, and the second interface is longer than the first interface in the first direction.

12. The MOSFET device of claim 10, wherein each of the first metal layer and the second metal layer comprises side surfaces that are spaced apart from each other in the first direction, the high-k layer has a U-shape and covers the lower surface of the first metal layer and both the side surfaces of the first metal layer, the WFC layer has a U-shape and covers the lower surface of the second metal layer and both the side surfaces of the second metal layer, the lower surface of the WFC layer forms a second interface with the upper surface of the first metal layer and uppermost surfaces of the high-k layer, and the second interface is longer than the first direction in the first direction.

13. The MOSFET device of claim 10, further comprising spacers that are respectively on the side surfaces of the gate structure, wherein inner side surfaces of the spacers each have a step or a planar shape adjacent the first interface.

14. The MOSFET device of claim 10, wherein the WFC layer comprises titanium aluminum carbide (TiAlC), and each of the first metal layer and the second metal layer comprises titanium nitride (TiN).

15. A metal oxide field-effect transistor (MOSFET) device comprising:

a substrate;

an active area on the substrate;

a gate structure on the active area, the gate structure comprising a high-k layer, a first metal layer, a work function control (WFC) layer, and a second metal layer that are sequentially stacked on the active area, and each of the high-k layer, the first metal layer, the WFC layer, and the second metal layer comprising a lower surface facing the active area and an upper surface opposite the lower surface; and source/drain regions respectively adjacent side surfaces of the gate structure, wherein the lower surface of the WFC layer protrudes outwardly beyond opposing ends of an interface between the lower surface of the first metal layer and the upper surface of the high-k layer.

16. The MOSFET device of claim 15, wherein the side surfaces of the gate structure are spaced apart from each other in a first direction, and portions of the lower surface of the WFC layer that protrude beyond the respective opposing ends of the interface have an equal length in the first direction.

17. The MOSFET device of claim 16, wherein the WFC layer comprises a WFC material, and a concentration of the WFC material on the interface is uniform along the first direction.

18. The MOSFET device of claim 15, wherein the side surfaces of the gate structure are spaced apart from each other in a first direction, and the high-k layer, the first metal layer, the WFC layer, and the second metal layer are stacked in a second direction, and the first metal layer has a thickness in the second direction, and the thickness is uniform along the first direction.

19. The MOSFET device of claim 15, wherein the side surfaces of the gate structure comprise side surfaces of the high-k layer, side surfaces of the first metal layer, and side surfaces of the WFC layer, the side surfaces of the first metal layer are coplanar with the side surfaces of the WFC layer, respectively, and the side surfaces of the high-k layer are recessed inwardly relative to the side surfaces of the first metal layer, respectively.

20. The MOSFET device of claim 15, wherein the high-k layer comprises a bottom portion that extends on the lower surface of the first metal layer and protruding portions that protrude respectively from end portions of the bottom portion toward the WFC layer and contact the lower surface of the WFC layer, the bottom portion and the protruding portions of the high-k layer define a space, and the first metal layer is in the space, and the side surfaces of the high-k layer are coplanar with the side surfaces of the WFC layer, respectively.

* * * * *